(12) United States Patent
Tominari et al.

(10) Patent No.: US 6,933,201 B2
(45) Date of Patent: Aug. 23, 2005

(54) METHOD FOR MANUFACTURING SEMICONDUCTOR DEVICE

(75) Inventors: Tatsuya Tominari, Ome (JP); Takashi Hashimoto, Akishima (JP); Tomoko Jinbo, Akishima (JP); Tsutomu Udo, Musashimurayama (JP)

(73) Assignees: Hitachi, Ltd., Tokyo (JP); Hitachi ULSI Sytems Co., Ltd., Tokyo (JP)

( * ) Notice: Subject to any disclaimer, the term of this patent is extended or adjusted under 35 U.S.C. 154(b) by 310 days.

(21) Appl. No.: 10/347,221

(22) Filed: Jan. 21, 2003

(65) Prior Publication Data

US 2003/0157774 A1 Aug. 21, 2003

(30) Foreign Application Priority Data

Feb. 20, 2002 (JP) .................................... 2002-043630

(51) Int. Cl.[7] ............................................. H01L 21/331
(52) U.S. Cl. ...................... 438/312; 438/203; 438/222
(58) Field of Search ................................ 438/199–204, 438/309–327

(56) References Cited

U.S. PATENT DOCUMENTS 6,066,520 A * 5/2000 Suzuki ....................... 438/202

* cited by examiner

Primary Examiner—H. Jey Tsai
(74) Attorney, Agent, or Firm—Miles & Stockbridge P.C.

(57) ABSTRACT

Provided is a manufacturing method of a semiconductor device, which comprises exposing a surface of a semiconductor substrate on which a heterocrystalline layer is to be grown inside of a second emitter opening portion of a hetero-junction bipolar transistor, removing water by preheat treatment in a reducing gas atmosphere, subjecting the substrate to second heat treatment in a reducing gas atmosphere at a temperature which is higher than the preheating treatment but does not adversely affect the impurity concentration distribution of another element on the semiconductor substrate, thereby removing an oxide film formed on the surface on which the heterocrystalline layer is to be grown, and then selectively causing epitaxial growth of the heterocrystalline layer on the thus cleaned surface in the second emitter opening portion. According to the present invention, reliability of a semiconductor device having a hetero-junction bipolar transistor can be improved.

23 Claims, 41 Drawing Sheets

METHOD FOR MANUFACTURING SEMICONDUCTOR DEVICE

TECHNICAL FIELD

The present invention relates to a method for manufacturing a semiconductor device and a semiconductor device technique, particularly to a method for manufacturing a semiconductor device having a hetero-junction bipolar transistor (which will hereinafter be abbreviated as "HBT") and a technique effective when applied to its structure.

BACKGROUND OF THE INVENTION

The HBT technique has been investigated mainly for the purpose of improving the high-speed performance of a bipolar transistor. In the HBT forming method investigated by the present inventors, high-temperature heat treatment (for example, at about 850 to 1200° C.) in a hydrogen gas ($H_2$) atmosphere is carried out just before selective formation of an SiGe layer over a silicon (Si) substrate, for example, by the epitaxial method in order to remove a silicon oxide film mainly by a reduction reaction from the surface on which the SiGe layer is to be grown, thereby cleaning the surface.

SUMMARY OF THE INVENTION

The present inventors have however found that the above-described HBT forming technique involves the following problems. Upon the above-described high temperature heat treatment in a hydrogen gas atmosphere, diffusion of an impurity from another element formed on the semiconductor substrate occurs, resulting in a deterioration in the electrical properties of the element. Particularly, since in a semiconductor device having HBT and CMIS (Complementary Metal Insulator Semiconductor) disposed on the same semiconductor substrate, CMIS is formed prior to HBT in order to ensure processing accuracy of CMIS, rapid diffusion of an impurity (boron or the like) in a p-type gate electrode of a p channel type MIS constituting CMIS occurs upon the above-described high temperature heat treatment in a hydrogen gas atmosphere for the formation of HBT, resulting in a problem such as fluctuations of a threshold voltage of the p-channel type MIS. When the above-described high temperature heat treatment in a hydrogen gas atmosphere is carried out simply at a decreased temperature, the surface on which an SiGe layer is to be grown cannot be cleaned sufficiently, and the SiGe layer becomes polycrystalline not single-crystalline, preventing its smooth growth. As a result, defects appear in the SiGe layer. A leakage current flows along the defects, causing problems such as increase in power consumption or inoperation of HBT.

An object of the present invention is therefore to provide a technique capable of improving the reliability of a semiconductor device equipped with HBT.

The above-described and the other objects and novel features of the present invention will be apparent from the description herein and accompanying drawings.

Of the inventions disclosed by the present application, the typical ones will next be described briefly.

In one aspect of the present invention, there is thus provided a method for manufacturing a semiconductor device, which comprises successively depositing, over a semiconductor substrate, a first insulating film, a second insulating film and a base electrode formation film and then introducing an oxidation promoting impurity into an upper-layer portion of the base electrode formation film; depositing a third insulating film over the base electrode formation film; partially removing the third insulating film and base electrode formation film, thereby forming a first emitter opening portion; oxidizing the resulting semiconductor substrate, thereby forming a fourth insulating film on the side surface of the base electrode formation film and at a corner on the side of the base electrode formation film in contact with the third insulating film, each inside of the first emitter opening portion; wet-etching the resulting semiconductor substrate to remove the second insulating film through the first emitter opening portion, thereby forming a second emitter opening portion which is opened so that the side surface of the second insulating film is separated from the side surface of the base electrode formation film inside of the first emitter opening portion and from which a portion of the base electrode formation film is exposed; washing the resulting semiconductor substrate with hydrofluoric acid to remove the first insulating film exposed from the second emitter opening portion; heat treating the resulting semiconductor substrate in a reducing gas atmosphere; and selectively forming, by the epitaxial method, a heterocrystalline layer over the semiconductor substrate exposed from the second emitter opening portion.

In another aspect of the present invention, there is also provided the above-described method wherein the heat treatment in a reducing gas atmosphere has a first heat treatment step wherein the semiconductor substrate is heat treated at a first temperature and a second heat treatment step wherein the semiconductor substrate is heat treated at a second temperature higher than the first temperature.

In a further aspect of the present invention, there is also provided the above-described method wherein the third insulating film is formed by chemical vapor deposition using a plasma.

In a still further aspect of the present invention, there is also provided a semiconductor device, having a hetero-junction bipolar transistor formation region over a semiconductor substrate, comprising:

(a) a collector region formed in a first active region encompassed by an isolation portion on the main surface of the semiconductor substrate;

(b) a heterocrystalline layer formed in contact with the collector region and forming a base region;

(c) a base electrode electrically connected to the heterocrystalline layer;

(d) an emitter region formed over the heterocrystalline layer;

(e) an emitter electrode electrically connected to the emitter region via a first emitter opening portion formed in the base electrode while being isolated from the base electrode, wherein the base electrode has a relatively high impurity concentration region on an upper layer side to which an interconnect is to be electrically connected.

In a still further aspect of the present invention, there is also provided the above-described semiconductor device having a field effect transistor formation region over the semiconductor substrate, comprising:

(f) semiconductor regions for source and drain formed in a second active region encompassed by the isolation portion on the main surface of the semiconductor substrate;

(g) a gate insulating film disposed over the second active region; and (h) a gate electrode disposed over the gate insulating film.

In a still further aspect of the present invention, there is also provided the above-described semiconductor device, wherein the field effect transistor has a p channel type field effect transistor having a p type gate electrode and an n channel type field effect transistor having an n type gate electrode.

DETAILED DESCRIPTION OF THE PREFERRED EMBODIMENTS

Figure 1:
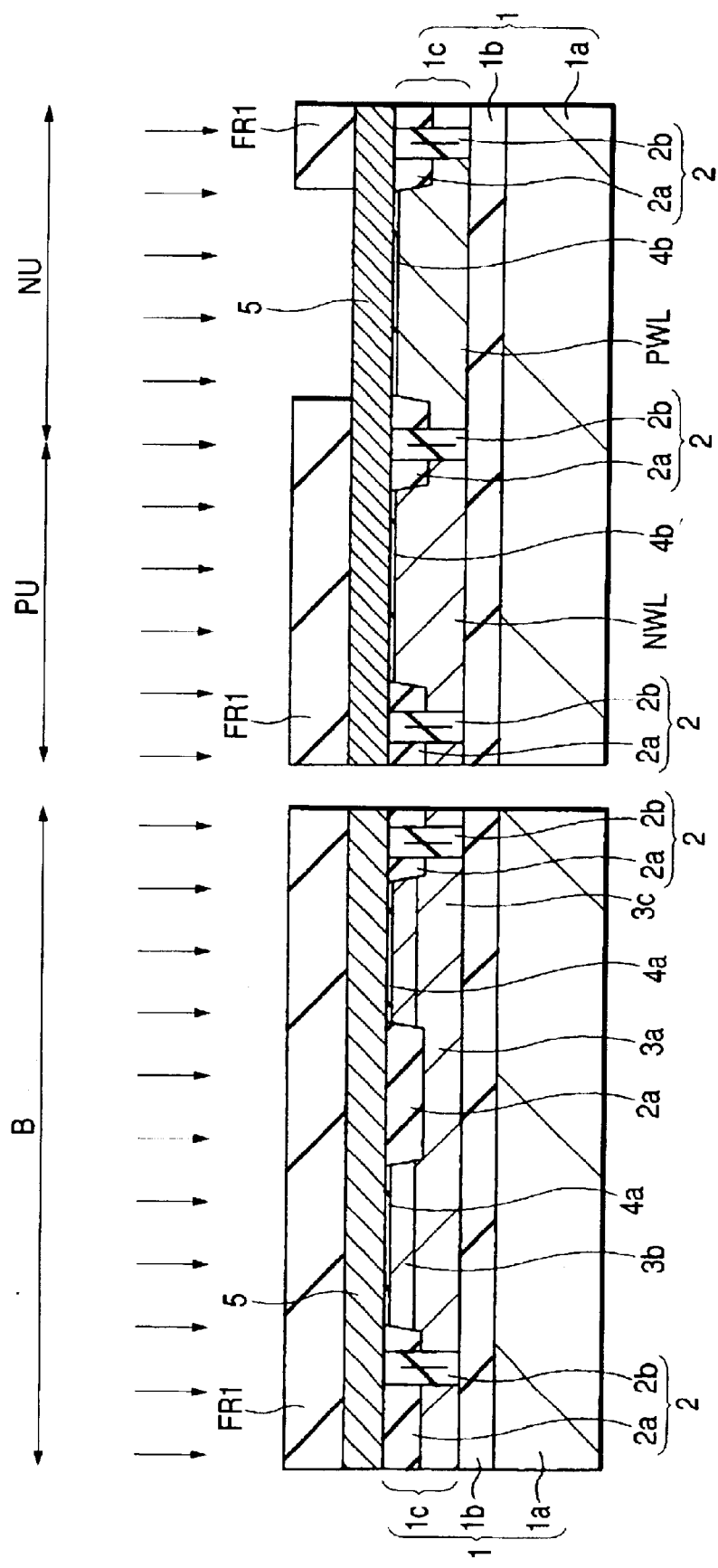
FIG. 1 is a fragmentary cross-sectional view of a semiconductor device according to one embodiment of the present invention during its manufacturing step.

Prior to describing the present embodiments, the meanings of the terms used herein will be explained below.

The term "high density plasma chemical vapor deposition (HDP-CVD)" usually means CVD using a plasma having an ion density of $10^{12}$ to $10^{13}/cm^3$. This method enables formation of a film while carrying out sputter etching, because owing to a high ion density, application of a bias RF (radio frequency) voltage on the side of a substrate causes collision of activated species against the substrate surface, thereby bringing about sputter etching effects.

In the below-described embodiments, a description will be made after divided in plural sections if necessary for convenience's sake. These plural sections are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be not greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential. Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range. In all the drawings for describing the below-described embodiments, elements having like function will be identified by like reference numerals and overlapping descriptions will be omitted. In the below-described embodiments, MIS•FET (Metal Insulator Semiconductor Field Effect Transistor) which is typical of field effect transistors will be abbreviated as MIS. A p-channel type MIS•FET and an n-channel type MIS•FET will be abbreviated as pMIS and nMIS, respectively. It is to be noted that MOS (Metal Oxide Semiconductor)•FET is a narrow term of MIS.

(Embodiment 1)

The semiconductor device according to Embodiment 1 of the present invention is used for, for example, communication tools such as optical communication system (photoelectric conversion device) of 10 Gb/s or 40 Gb/s, cellular phones or electron devices for Bluetooth. One example of a manufacturing method of the semiconductor device of Embodiment 1 will hereinafter be described with reference to FIGS. 1 to 33. Described here is a manufacturing method of a semiconductor device having, on one semiconductor substrate, both a hetero-junction bipolar transistor (HBT) and a CMIS (Complementary MIS) circuit.

FIG. 1 is a fragmentary cross-sectional view of the semiconductor device during its manufacturing step. Indicated at numerals B, PU, NU are an HBT formation region, a pMIS formation region and an nMIS formation region, respectively. Illustrated here is an npn type HBT capable of achieving high-speed operation, but a pnp type HBT can be formed alternatively. A semiconductor substrate (which will hereinafter be called "substrate", simply) 1 is made of an SOI (Silicon On Insulator) wafer having a substantially circular plane. The substrate 1 has a supporting substrate $1a$ and thereover a semiconductor layer $1c$ via an insulating layer $1b$. The supporting substrate $1a$ is made of, for example, single crystal silicon (Si) and serves to maintain the mechanical strength of the substrate 1. The insulating layer $1b$ is made of, for example, silicon oxide ($SiO_x$). The semiconductor layer $1c$ is made of, for example, a single crystal silicon layer and has a semiconductor layer formed from a semiconductor wafer and another semiconductor layer formed thereover by the epitaxial method. Over this semiconductor layer $1c$, a device is formed.

In an isolating region on the main surface (surface on which the device is to be formed) of the semiconductor layer $1c$, a shallow groove isolation (SGI) $2a$ and a deep trench isolation $2b$ are formed. The shallow groove isolation $2a$ is formed by embedding, for example, a silicon oxide film in a shallow groove made in the semiconductor layer $1c$ so as not to be brought in contact with the insulating layer $1b$. By this shallow groove isolation $2a$, a two-dimensional range of the active region is defined. The deep trench isolation $2b$, on the other hand, is formed by embedding, for example, a silicon oxide film in a deep trench starting from the upper surface of the shallow groove isolation $2a$, penetrating through this shallow groove isolation $2a$ and semiconductor layer $1c$, and then reaching the insulating layer $1b$. By this deep trench isolation $2b$, device regions in the semiconductor layer $1c$ are electrically separated each other completely. The isolation $2a$ may be formed, for example, by the LOCOS (Local Oxidation of Silicon) method.

In the semiconductor layer $1c$ of the HBT formation region B, an $n^+$ type collector buried region $3a$ is formed. This collector buried region $3a$ contains, for example, antimony (Sb). Over this collector buried region $3a$, an n type collector region $3b$ and an $n^+$ type collector extraction region $3c$ are formed. These collector region $3b$ and collector extraction region $3c$ contain, for example, phosphorus (P). These collector region $3b$ and collector extraction region $3c$ are separated each other by the shallow groove isolation $2a$ disposed therebetween, but they are electrically connected via the collector buried region $3a$. Over the upper surface of the semiconductor layer $1c$ in the active region of the HBT region B, an insulating film $4a$ made of, for example, a silicon oxide film is formed. On the other hand, an n well NWL is formed in the semiconductor layer $1c$ of the pMIS formation region PU, while a p well PWL is formed in the semiconductor layer $1c$ of the nMIS formation region NU. The n well NWL contains phosphorus (P) or arsenic (As), while the p well PWL contains boron (B). Over the upper surface of the semiconductor layer $1c$ in the active region of each of the pMIS formation region PU and nMIS formation region NU, a gate insulating film $4b$ made of, for example, a silicon oxide film is formed. This gate insulating film $4b$ may be made of a silicon oxynitride film. This means that nitrogen may be segregated on the interface between the gate insulating film $4b$ and the semiconductor layer $1c$. Since a silicon oxynitride film is more effective for suppressing generation of an interface state in a film or reducing electron traps than a silicon oxide film, it is capable of improving hot carrier resistance of the gate insulating film $4b$, thereby improving dielectric resistance. Moreover, since the silicon oxynitride film does not permit easy penetration of an impurity therethrough compared with a silicon oxide film, use of it can suppress fluctuations of a threshold voltage which will otherwise occur by the diffusion of an impurity (particularly, boron of a p type gate) in a gate electrode material toward the semiconductor layer $1c$. This silicon oxynitride film may be formed, for example, by heat treating the substrate 1 having the gate insulating film $4b$ formed thereover in an atmosphere containing a nitrogen gas such as $NO$, $NO_2$ or $NH_3$.

Figure 2:
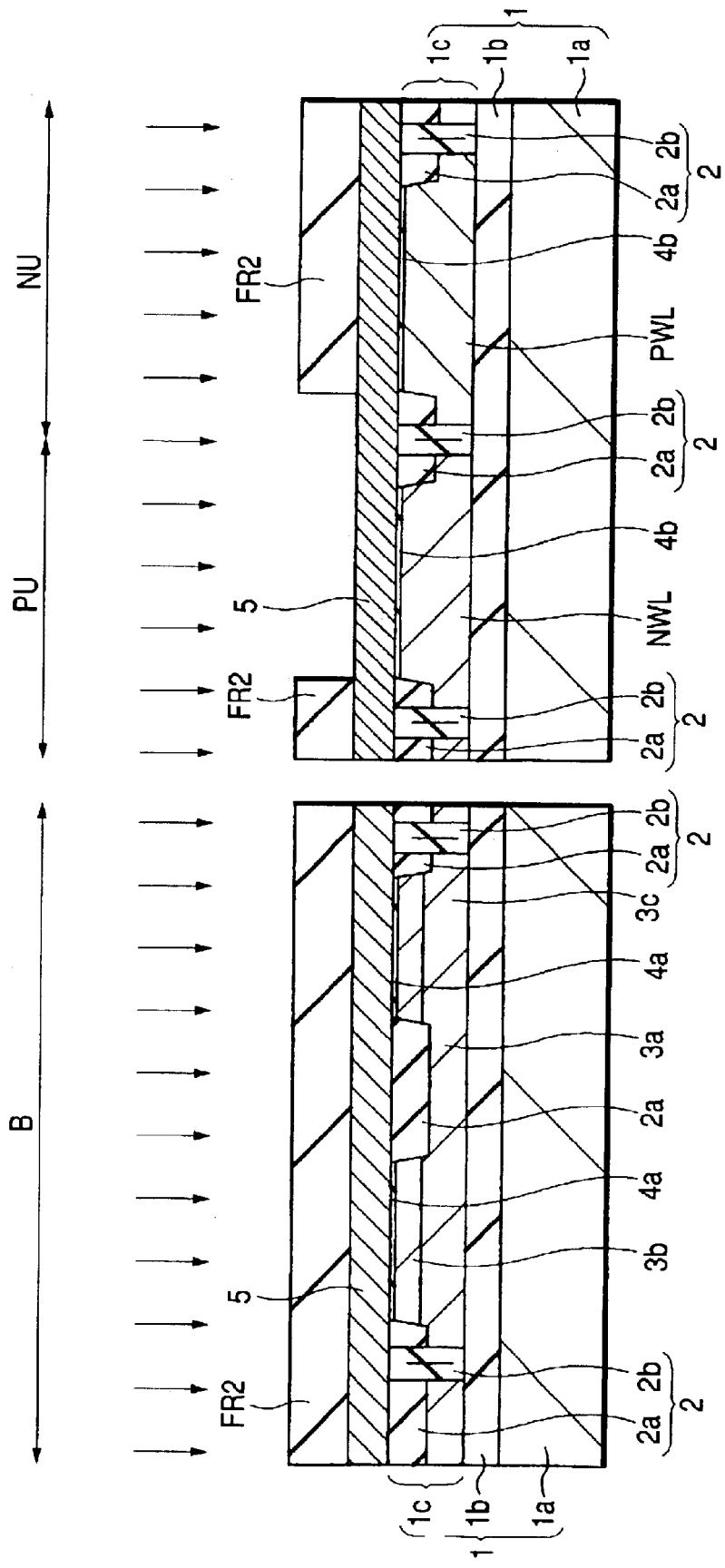
FIG. 2 is a fragmentary cross-sectional view of the semiconductor device during its manufacturing step following the step of FIG. 1.
Figure 3:
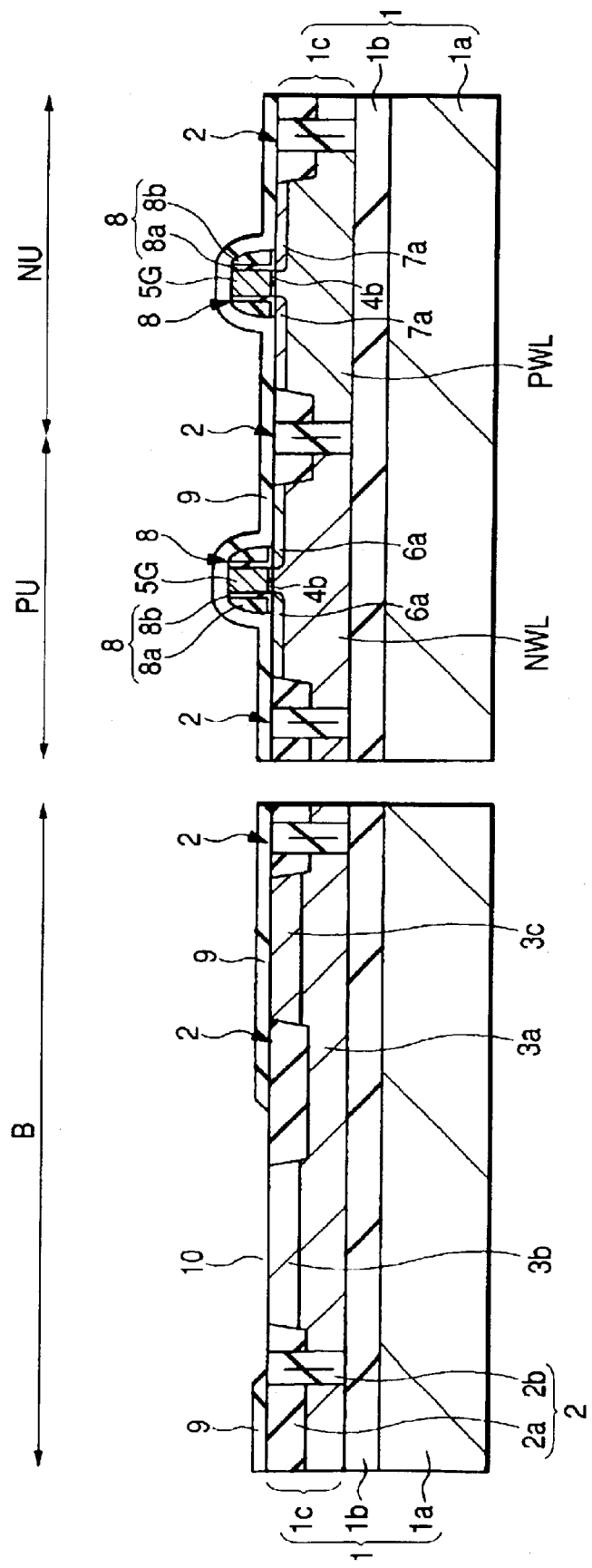
FIG. 3 is a fragmentary cross-sectional view of the semiconductor device during its manufacturing step following the step of FIG. 2.
Figure 4:
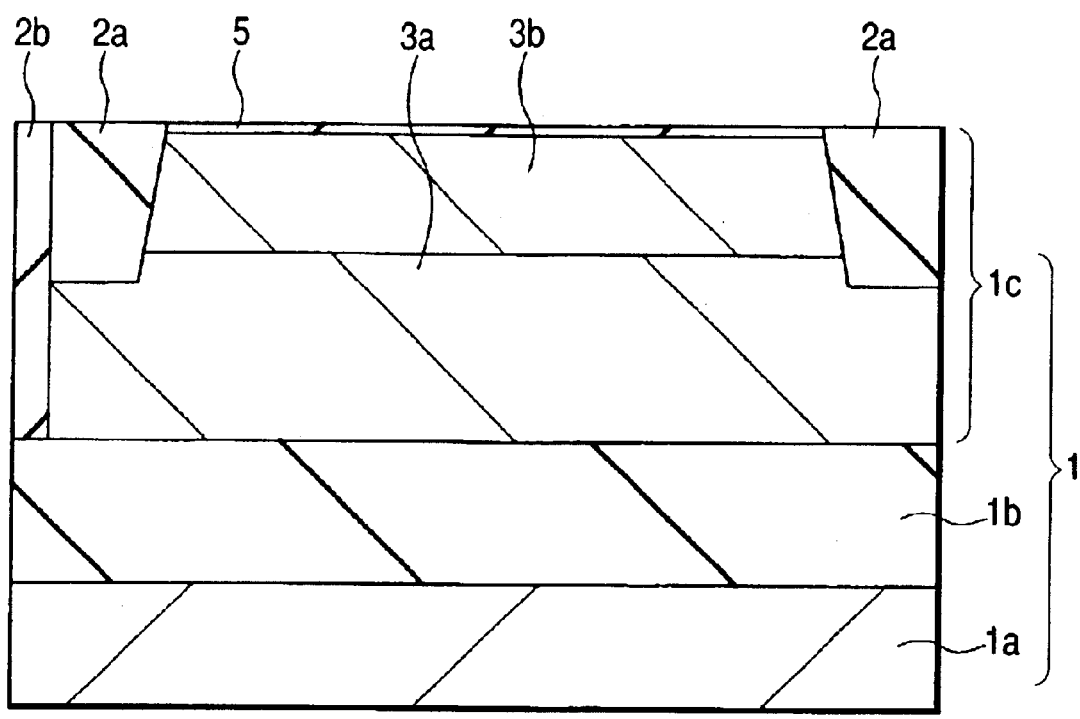
FIG. 4 is an enlarged fragmentary cross-sectional view illustrating a bipolar transistor formation region of FIG. 3.

After deposition of a gate electrode forming film 5 made of, for example, a polycrystalline silicon film over a device formation surface of the substrate 1 (SOI wafer) by CVD (Chemical Vapor Deposition), a photoresist pattern (which will hereinafter be called "resist pattern", simply) FR1 is formed by photolithography (which will hereinafter be called "lithography", simply) in such a manner so as to cover therewith the HBT formation region B and pMIS formation region PU and expose therefrom the gate electrode formation region of the nMIS formation region. With the resist pattern FR1 as an ion implantation mask, phosphorus (P) is implanted into the gate electrode formation film 5 of the nMIS formation region NU, followed by removal of the resist pattern FR1. FIG. 2 is a fragmentary cross-sectional view of the semiconductor device during its manufacturing step following the step of FIG. 1. In this step, a resist pattern FR2 is formed by lithography in such a manner as to cover therewith the HBT formation region B and nMIS formation region NU and expose therefrom the gate electrode formation region of the pMIS formation region. With the resist pattern FR2 as an ion implantation mask, boron (B) is implanted into the gate electrode formation film 5 of the pMIS formation region PU, followed by removal of the resist pattern FR2. These two ion implantation treatments of FIG. 1 and FIG. 2 may be reversed in the order. FIG. 3 is a fragmentary cross-sectional view of the semiconductor device during its manufacturing step following the step of FIG. 2 and FIG. 4 is an enlarged fragmentary cross-sectional view of the HBT formation region of FIG. 3. In this step, a gate electrode 5G is formed by patterning the gate electrode formation film 5 by lithography and dry etching. The gate electrode 5G of the pMIS formation region PU is formed to have a p type, while the gate electrode 5G of the nMIS formation region NU is formed to have an n type. In short, the device of this Embodiment 1 has a dual gate electrode structure. A p$^-$ type semiconductor region (first semiconductor region) 6a of a low impurity concentration is then formed in the pMIS formation region PU for each of a source and a drain, while an n$^-$ type semiconductor region (first semiconductor region) 7a of a low impurity concentration for each of a source and a drain is formed in the nMIS formation region NU. The semiconductor region 6a contains, for example, boron, while the semiconductor region 7a contains, for example, arsenic. These semiconductor regions 6a, 7a are formed by ion implantation treatments, respectively with different resist patterns as an ion implantation mask. Alternatively, with different ion implantation masks for the formation of the semiconductor regions 6a, 7a as a mask, an impurity for the formation of a punch-through stopper (for suppressing short channel effects between source and drain) may be implanted into the semiconductor layer 1c. Then, sidewalls (sidewall insulating films) 8 are formed on the side surfaces of the gate electrode 5G. The sidewalls 8 each has a relatively thin insulating film 8a formed in contact with the gate electrode 5G and a relatively thick insulating film 8b formed in contact with the surface of the film 8a. The insulating film 8a is made of, for example, a silicon oxide film and the insulating film 8b is made of, for example, a silicon nitride film. Up to this stage, a major part of the pMIS and nMIS structures are formed. The gate electrode of MIS is formed prior to the formation of HBT, because the underground before the formation of HBT is excellent in flatness and this facilitates processing of the gate electrode of MIS and improves processing accuracy of the gate electrode. Then, after deposition of an insulating film 9 made of, for example, a silicon oxide film, over the device formation surface of the substrate 1 (SOI wafer) by CVD, an opening 10 is formed to expose the collector region 3b and a peripheral region thereof in the HBT formation region. Over the semiconductor layer 1c in this opening 10, an insulating film (first insulating film) 1 made of, for example, a silicon oxide film is formed by thermal oxidation or CVD (refer to FIG. 4). The insulating film 11 has a thickness of about 6 nm in terms of silicon dioxide.

Figure 5:
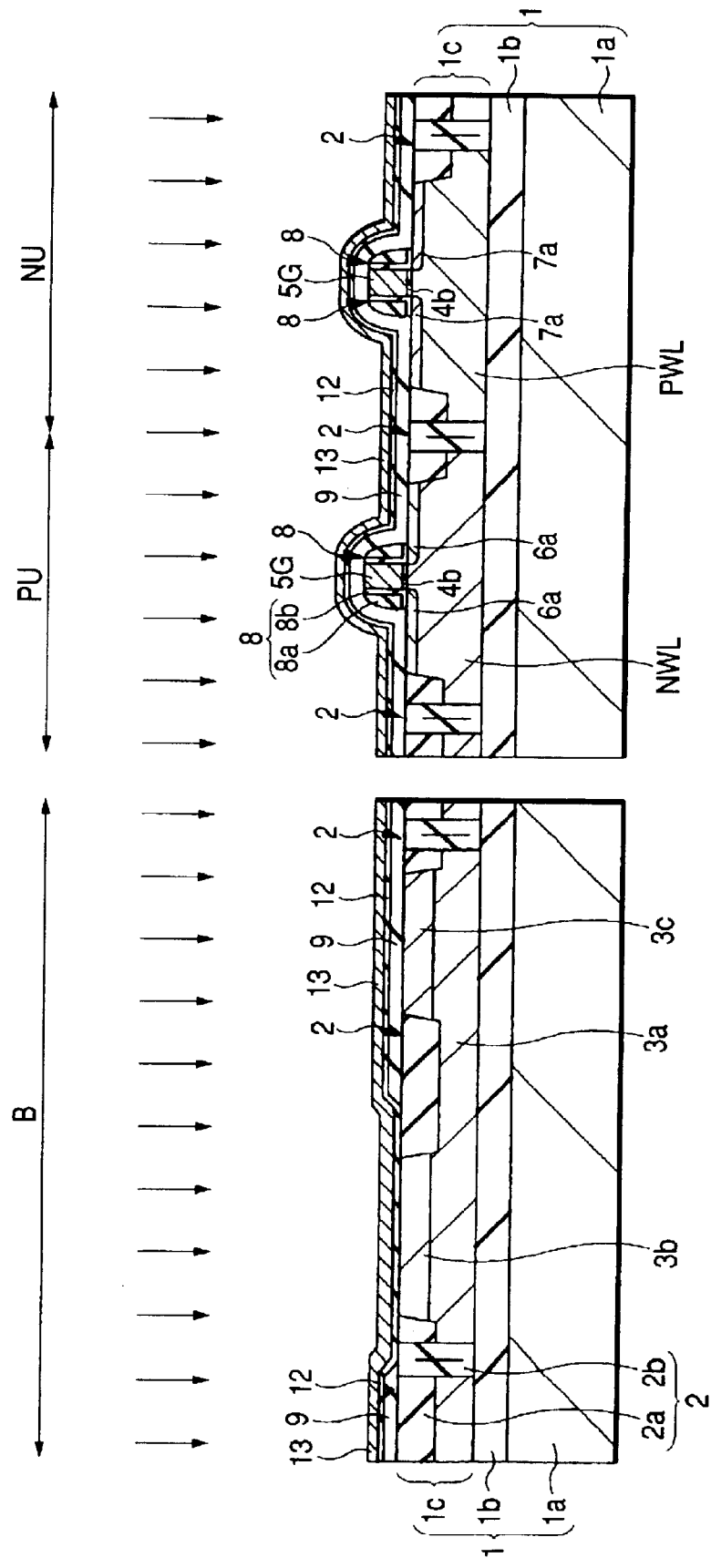
FIG. 5 is a fragmentary cross-sectional view of the semiconductor device during its manufacturing step following the step of FIG. 3.
Figure 6:
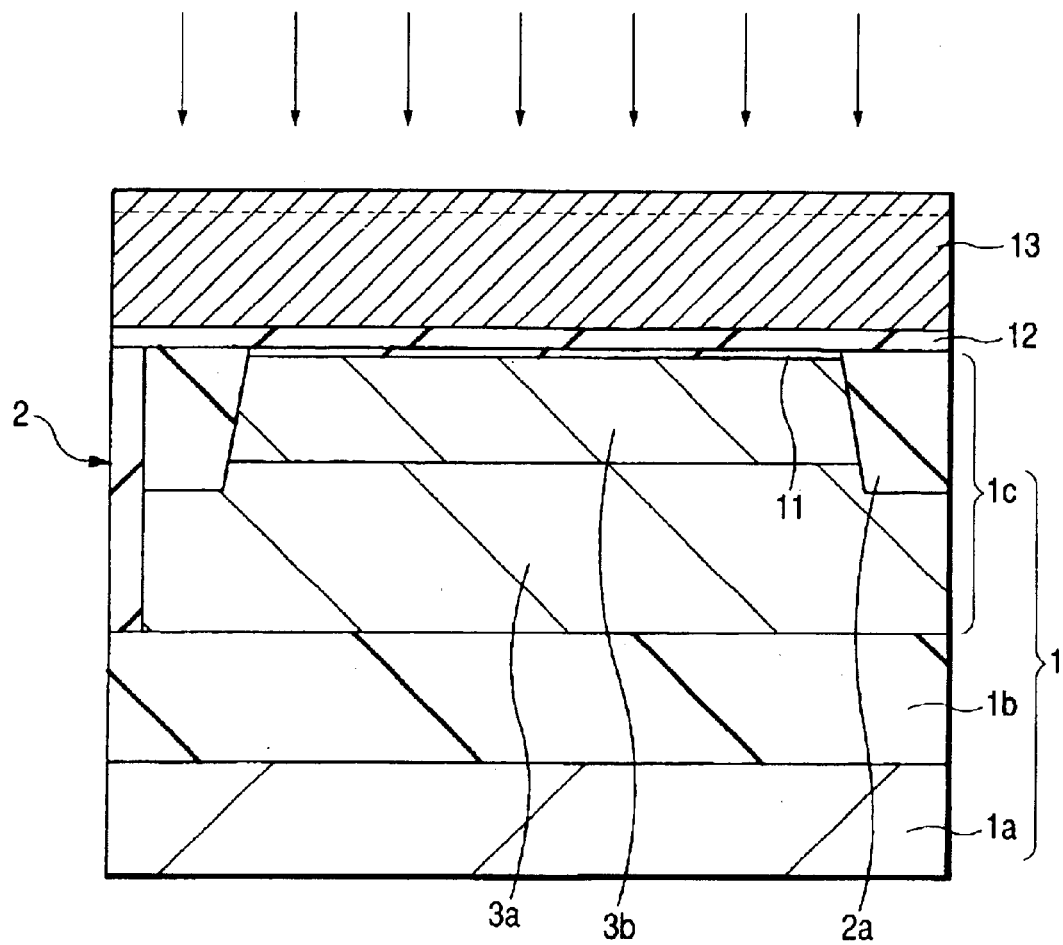
FIG. 6 is an enlarged fragmentary cross-sectional view of a bipolar transistor formation region during the second ion implantation step of FIG. 5.
Figure 7:
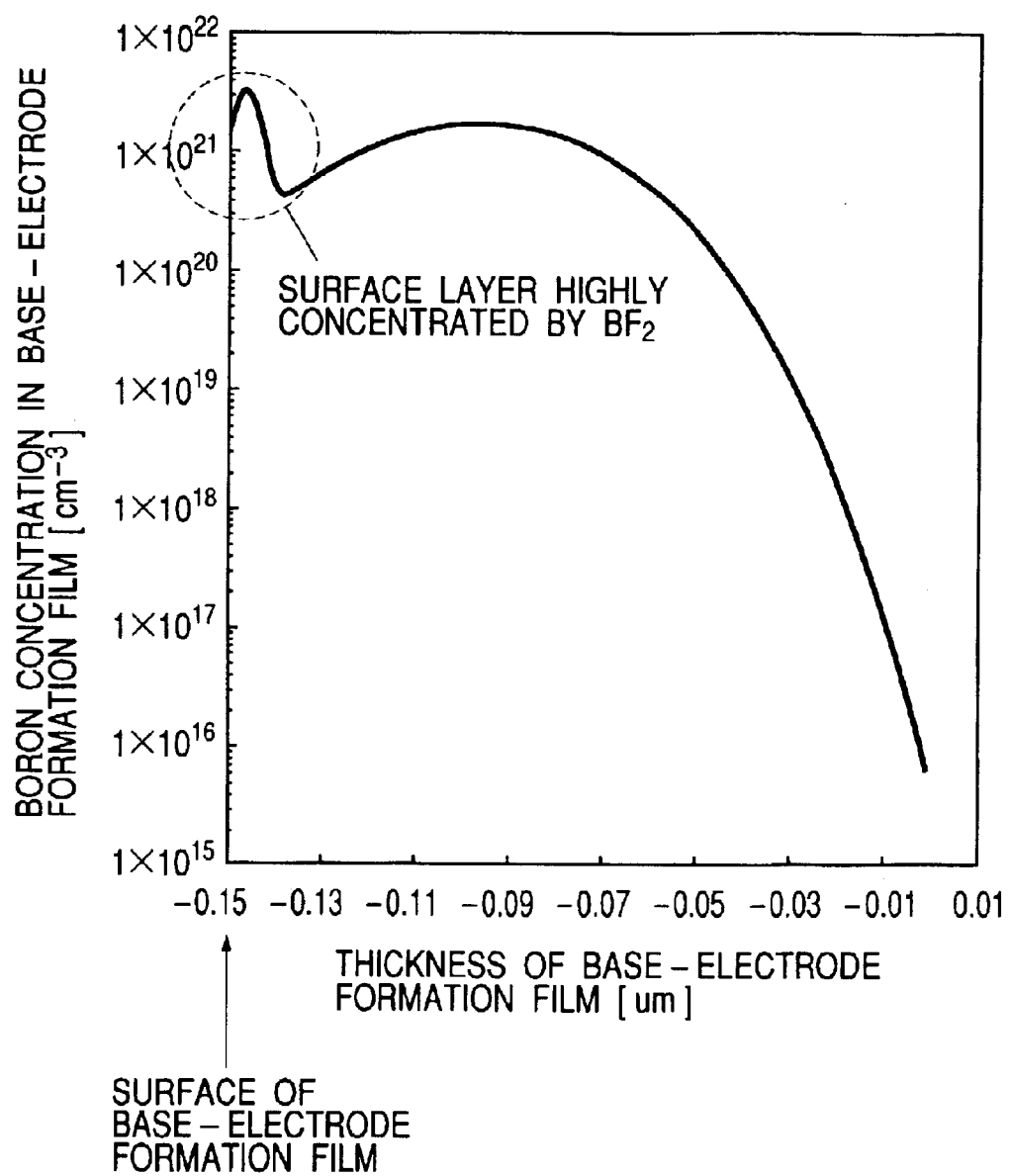
FIG. 7 is a graph of impurity concentration distribution of a base lead electrode formation film after the step of FIG. 5.

FIG. 5 is a fragmentary cross-sectional view of the semiconductor device during its manufacturing step following the step of FIG. 3, FIG. 6 is an enlarged fragmentary cross-sectional view of the HBT formation region during the second ion implantation step of FIG. 5, and FIG. 7 is a graph showing the impurity concentration distribution of a base lead electrode formation film after the step of FIG. 5. After deposition of an insulating film (second insulating film) 12 made of, for example, a silicon nitride film over the device formation surface of the substrate 1 by CVD, a base electrode formation film 13 made of non-doped polycrystalline silicon film of about 150 nm thick is deposited thereover by CVD. An impurity is then implanted into the base electrode formation film 13 in order to lower its electric resistance (first impurity introducing step). In this impurity introducing step, conditions are set out so that the impurity is finally distributed almost all over the thickness direction of the base electrode formation film 13. For example, boron is implanted at a dose of $1\times10^{16}$/cm$^2$ and ion implantation energy of 15 keV. Then, in this Embodiment 1, an atom for promoting the oxidation of the base electrode formation film 13 is implanted thereinto (second impurity introducing step). In this impurity introducing step, conditions are set out so that the atom for promoting oxidation is distributed in the upper layer portion of the base electrode formation film 13 or an amorphous layer formed by the introduction of the atom is formed in the upper layer portion of the base electrode formation film. FIG. 6 schematically illustrates the implantation of the oxidation promoting atom (or formation of an amorphous layer due to the atom implantation) from the upper surface of the base electrode formation film 13 toward a broken line. For example, boron difluoride (BF$_2$) is implanted at a dose of about $2\times10^{15}$/cm$^2$ and ion implantation energy of about 3 keV. FIG. 7 shows an impurity distribution in the thickness direction of the base electrode formation film 13. In the surface layer portion of the base electrode formation film 13, an impurity concentration distribution having a steep peak due to boron difluoride is formed. By the second impurity introducing step, the concentration of boron (B) in the upper layer portion of the base electrode formation film 13 becomes higher by at least an order of magnitude (for example, $5\times10^{21}$/cm$^3$) than the concentration of boron (B) implanted by the first impurity introducing step. In consideration of the surface etching of the base electrode formation film 13 depending on the subsequent processing conditions (for example, washing), the ion implantation depth in the second impurity introducing step is set out so that the peak of the boron concentration exists in the upper layer portion of the base electrode formation film 13 exposed just before a step of oxidizing the inner side surface of the base electrode formation film 13 inside of an emitter opening portion which will be described later.

Boron difluoride is used, for example, because of the following reason. Boron difluoride does not penetrate deeply owing to a mass greater than that of boron so that an ion can be implanted, at a high impurity concentration, into the surface layer portion (shallow position) of the base electrode formation film 13 even at a low energy. Since the base electrode of HBT is formed to have a p type, an impurity having the same conductivity type is preferred for its electrical properties. As oxidation promoting atom, not only boron difluoride but also various atoms can be used, for example, arsenic, germanium (Ge), silicon and oxygen (O). Among them, arsenic is most effective for rapid oxidation so that even at a relatively low oxidation treatment temperature of the base electrode formation film 13, the desired oxidation can be attained and improvement of the electrical properties of the device to be formed on the substrate 1 can be promoted. When arsenic which is an impurity to impart an n type is selected, it forms a pn junction in the upper layer portion of the p type base electrode formation film 13. According to the test by the present inventors, no particular problems occurred in the electrical properties, which is presumed to owe to the removal of this pn junction by the silicide formation which will be described later. When the HTB is a pnp type, the base electrode is an n type so that use of arsenic causes no problem. When germanium or silicon is used instead, it accelerates oxidation by making the upper layer portion of the base electrode formation film 13 amorphous. Use of germanium or silicon does not cause any problem in electrical properties, because it does not give a special conductivity type. When oxygen is used, on the other hand, it accelerates oxidation by transformation to amorphous and direct introduction of an oxygen atom necessary for oxidation.

Figure 8:
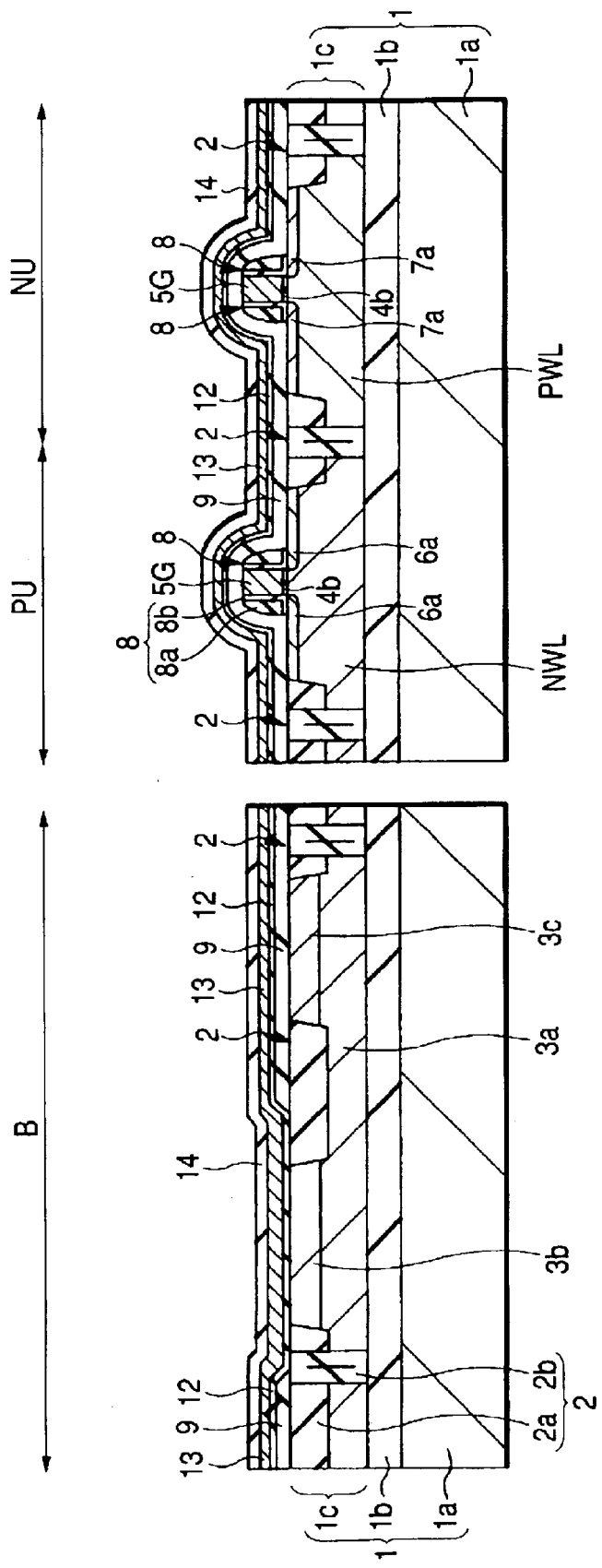
FIG. 8 is a fragmentary cross-sectional view of the semiconductor substrate during its manufacturing step following the step of FIG. 5.
Figure 9:
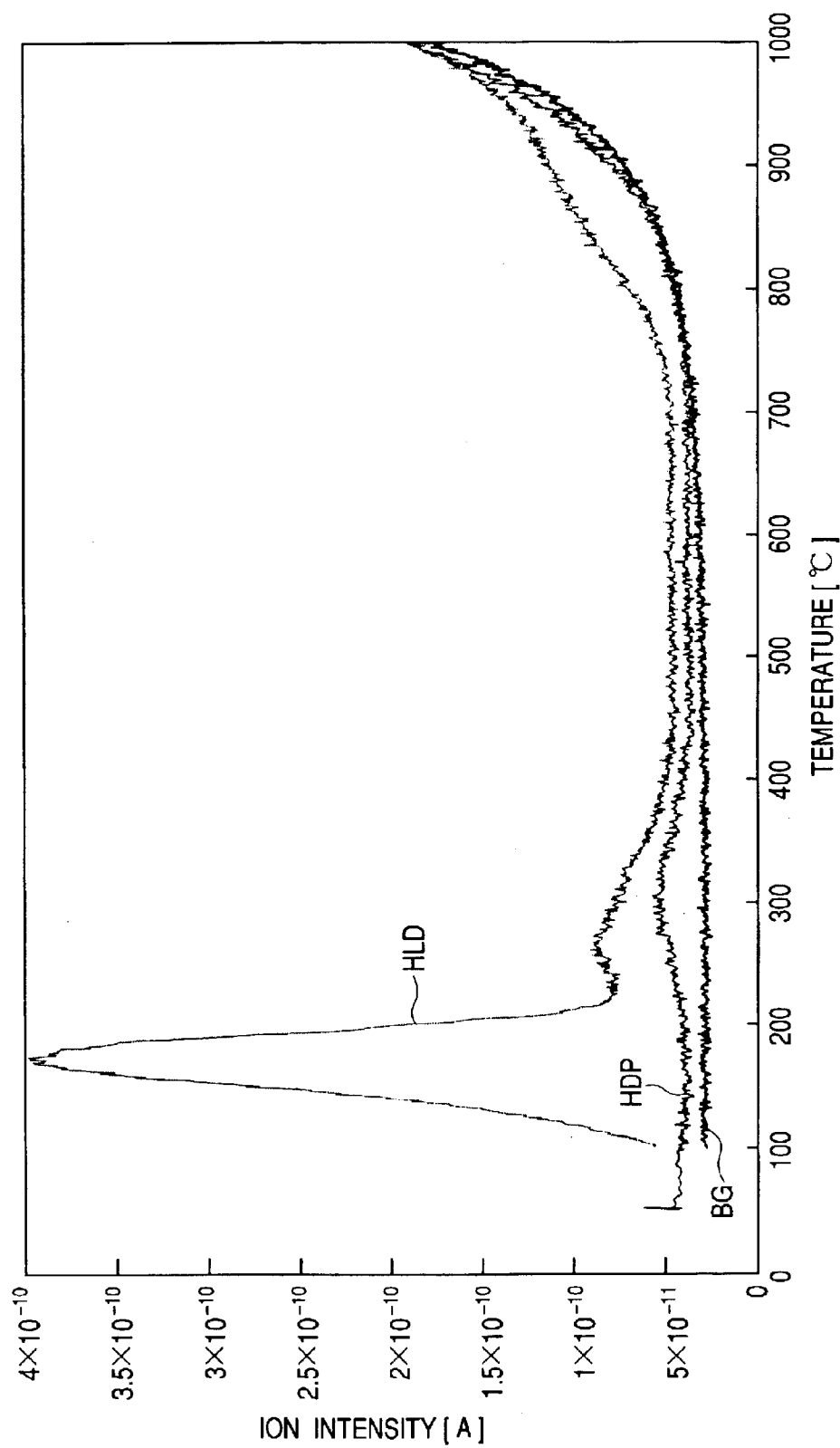
FIG. 9 is a graph showing the analysis results of water elimination relative to the heat treating temperature of each insulating film.

FIG. 8 is a fragmentary cross-sectional view of the semiconductor device during its manufacturing step following the step of FIG. 5. In this step, an insulating film (third insulating film 14) made of, for example, a silicon oxide film having a thickness of 150 nm is deposited over the base electrode formation film 13 by CVD using plasma, such as high-density plasma CVD (HDP-CVD). According to the technique investigated by the present inventors, the insulating film 14 is formed by high-temperature low-pressure CVD using an organic gas such as TEOS (Tetraethoxysilane) gas. In this case, however, water tends to penetrate into the insulating film 14, and a large amount of water is eliminated from the insulating film 14 upon reductive cleaning or heat treatment for growing a heterocrystalline layer which will be described later. As a result, the surface on which the heterocrystalline layer grows is oxidized and the heterocrystalline layer becomes not single crystalline but polycrystalline, which sometimes impairs crystallinity. Then, defects appear in the heterocrystalline layer and a leakage current flows along these defects, whereby problems such as increase in the power consumption and inoperation of HBT become prominent. The insulating film 14 formed by the HDP-CVD method as in Embodiment 1, on the other hand, has a relatively small content of water so that an amount of water generated upon heat treatment for growing a heterocrystalline layer can be decreased greatly. FIG. 9 shows the analysis results of water elimination from various insulating films, depending on heat treatment temperature. Indicated at numerals HLD, HDP and BG are water generation distribution when the insulating film 14 is formed by the above-described high-temperature low-pressure CVD using an organic gas, water generation distribution when the insulating film 14 is formed by the HDP-CVD method and background of the measuring instrument, respectively. When the insulating film 14 is formed by high-temperature low-pressure CVD, water elimination occurs during an increase in temperature to the growth temperature of the SiGe layer at about 600 to 800° C. Even at around 800° C., a water generation peak, though slow, is observed. The surface on which the heterocrystalline layer is to be formed is re-oxidized during temperature elevation and it becomes necessary to remove the resulting re-oxidized film by high-temperature annealing in a reducing gas (hydrogen gas) atmosphere. When the insulating film 14 is formed by the above-described HDP-CVD method, on the other hand, its water generation amount is smaller as shown by the water generation distribution HDP than that of the insulating film 14 formed by the high-temperature low-pressure CVD method. Moreover, when the insulating film 14 is formed by HDP-CVD, a slow water generation peak is observed at around 300° C., but there hardly exists water generation distribution at around 800° C. Accordingly, when the insulating film 14 is formed by HDP-CVD, generation of re-oxidation on the heteroepitaxial surface can be controlled or suppressed, which makes it possible to decrease a heat treating temperature in a reducing gas atmosphere which will be described later. The insulating film 14 is formed under the following conditions: film forming temperature of about 490° C., a bias radio-frequency (RF) power of about 400W, and use, as a gas, of a mixed gas of monosilane ($SiH_4$), oxygen ($O_2$), and argon (Ar). The ordinarily employed HDP-CVD apparatus is not equipped with a substrate heating mechanism so that temperature is determined, depending on the bias radio-frequency power. The higher the film forming temperature, the smaller the water content in the insulating film 14 becomes and the less water elimination by the below-described heat treatment, but sputtering action by an argon upon film formation deteriorates the step covering shape (covering ratio) of the gate electrode in the MIS formation region. It is therefore preferred to set out the film forming conditions of the insulating film 14, with both water elimination and covering property taken into consideration. It is to be noted that upon formation of the insulating film 14, the active region (surface of the semiconductor layer 1c on which the heterocrystalline layer is to be grown) of HBT is not exposed so that the active region is free from a plasma damage.

Figure 10:
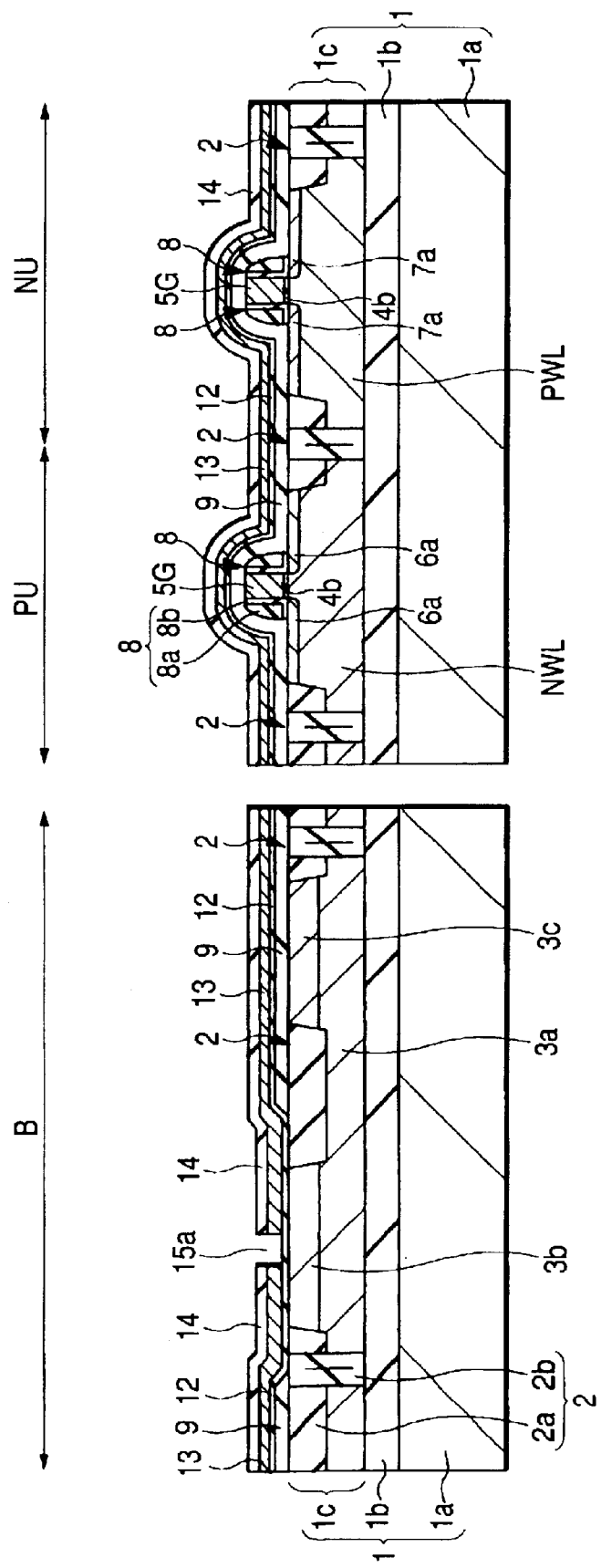
FIG. 10 is a fragmentary cross-sectional view of the semiconductor device during its manufacturing step following the step of FIG. 8.
Figure 11:
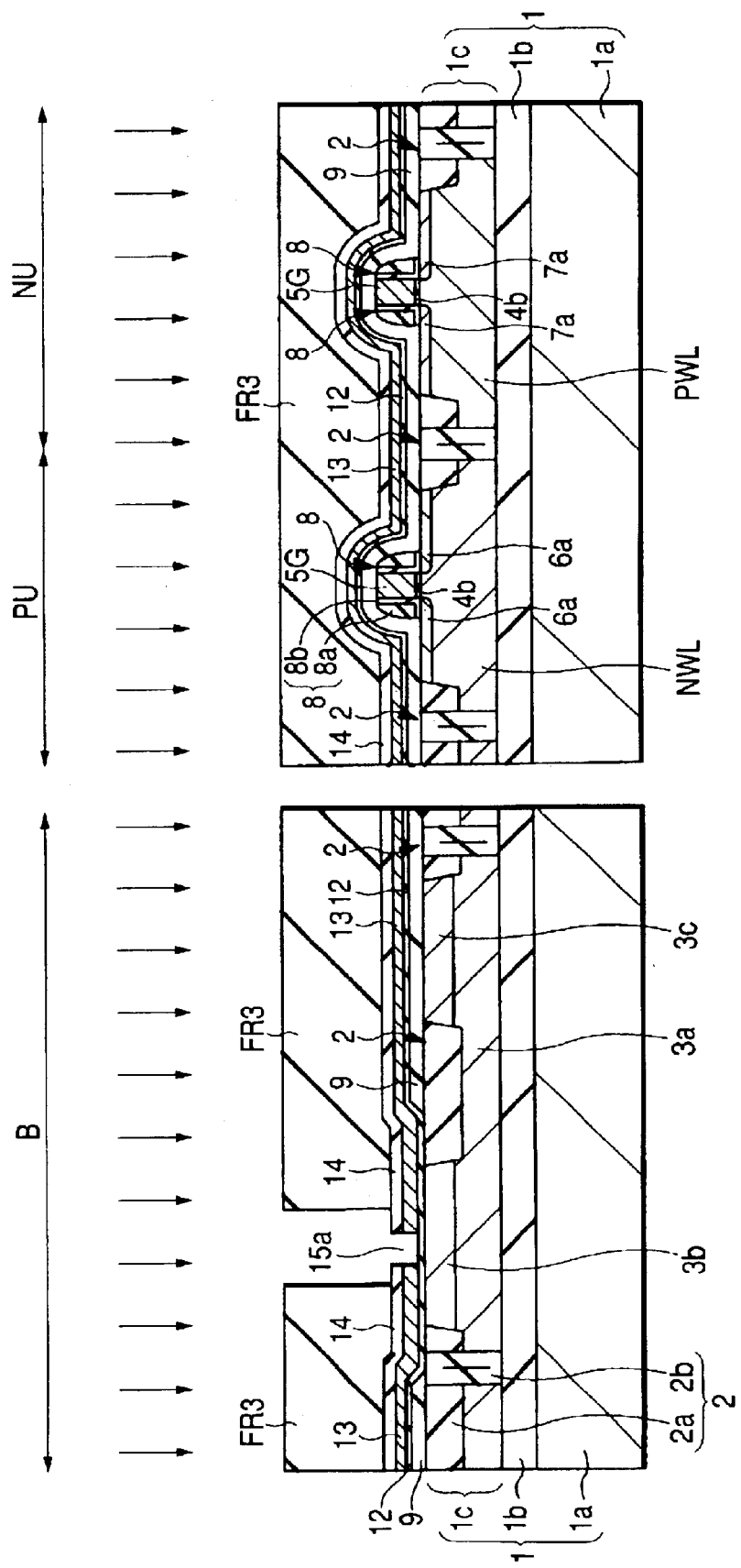
FIG. 11 is a fragmentary cross-sectional view of the semiconductor device during its manufacturing step following the step of FIG. 10.
Figure 12:
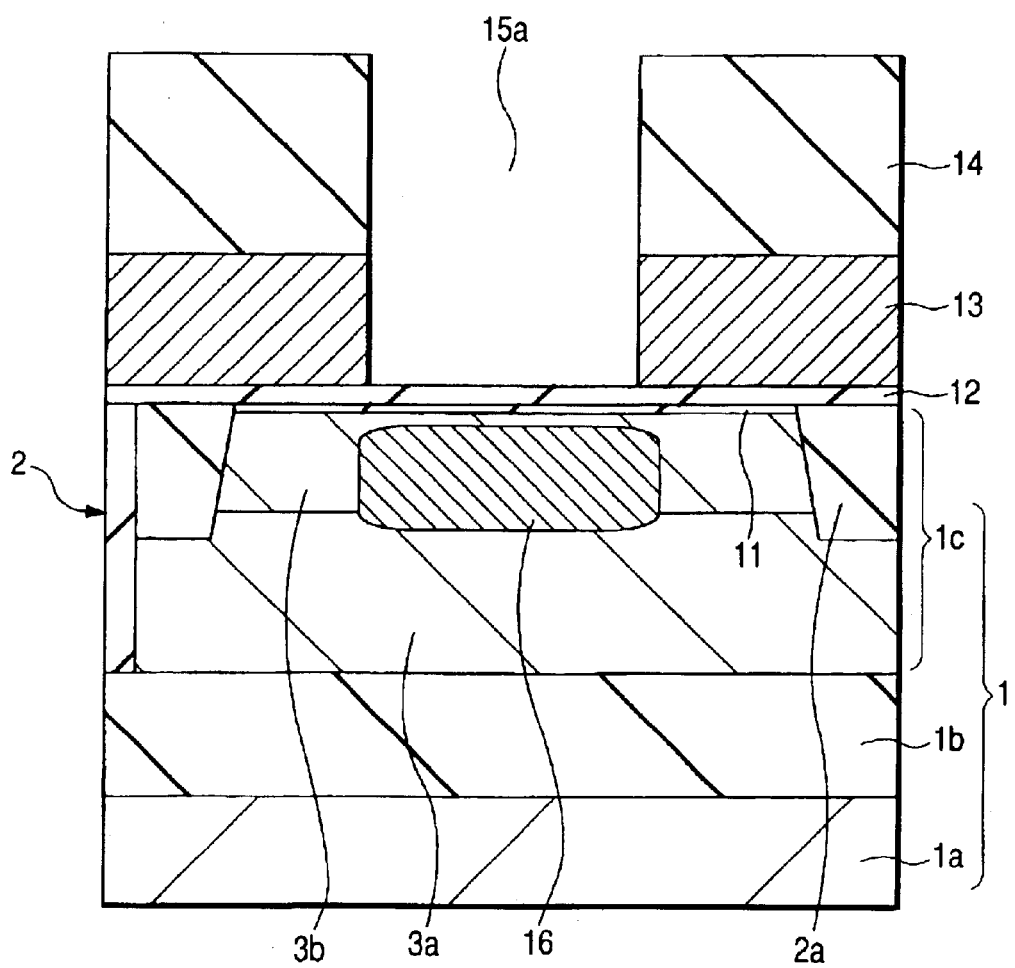
FIG. 12 is an enlarged fragmentary view of the bipolar transistor formation region after the step of FIG. 11.

FIG. 10 is a fragmentary cross-sectional view of the semiconductor device during its manufacturing step following the step of FIG. 8. In this step, a first emitter opening portion 15a is formed by partially removing the insulating film 14 and base electrode formation film 13 from the collector region 3b of the HBT formation region by lithography and dry etching. The insulating film 12 is exposed from the bottom surface of this first emitter opening portion 15a, while the base electrode formation film 13 is exposed from the inner side surface of the first emitter opening portion 15a. The plane size of the first emitter opening portion 15a is, for example, about 0.35 $\mu m \times$ about 2.0 $\mu m$. FIG. 11 is a fragmentary cross-sectional view of the semiconductor device during its manufacturing step following the step of FIG. 10. In this step, after formation, over the insulating film 14, of a resist pattern FR3 in such a manner as to expose the first emitter opening portion 15a and to cover another portion, phosphorus is implanted to the semiconductor layer 1c under the conditions of 20 keV and $5 \times 10^{12}$ $cm^{-2}$ with the resist pattern FR3 as a mask. This ion implantation step is first ion implantation for the formation of the SIC (Selective Implanted Collector) region 16 in the semiconductor layer 1c. The frequency characteristics of HBT can be improved by this implantation. After removal of the resist pattern FR3, the substrate 1 (SOI wafer) is washed, for example, with hydrofluoric acid. FIG. 12 is an enlarged fragmentary cross-sectional view of the HBT formation region after the step of FIG. 11. At this stage, the inner side surface of the base electrode formation film 13 and inner side surface of the insulating film 14 almost coincide each other in the inner side surface of the first emitter opening portion 15a.

Figure 13:
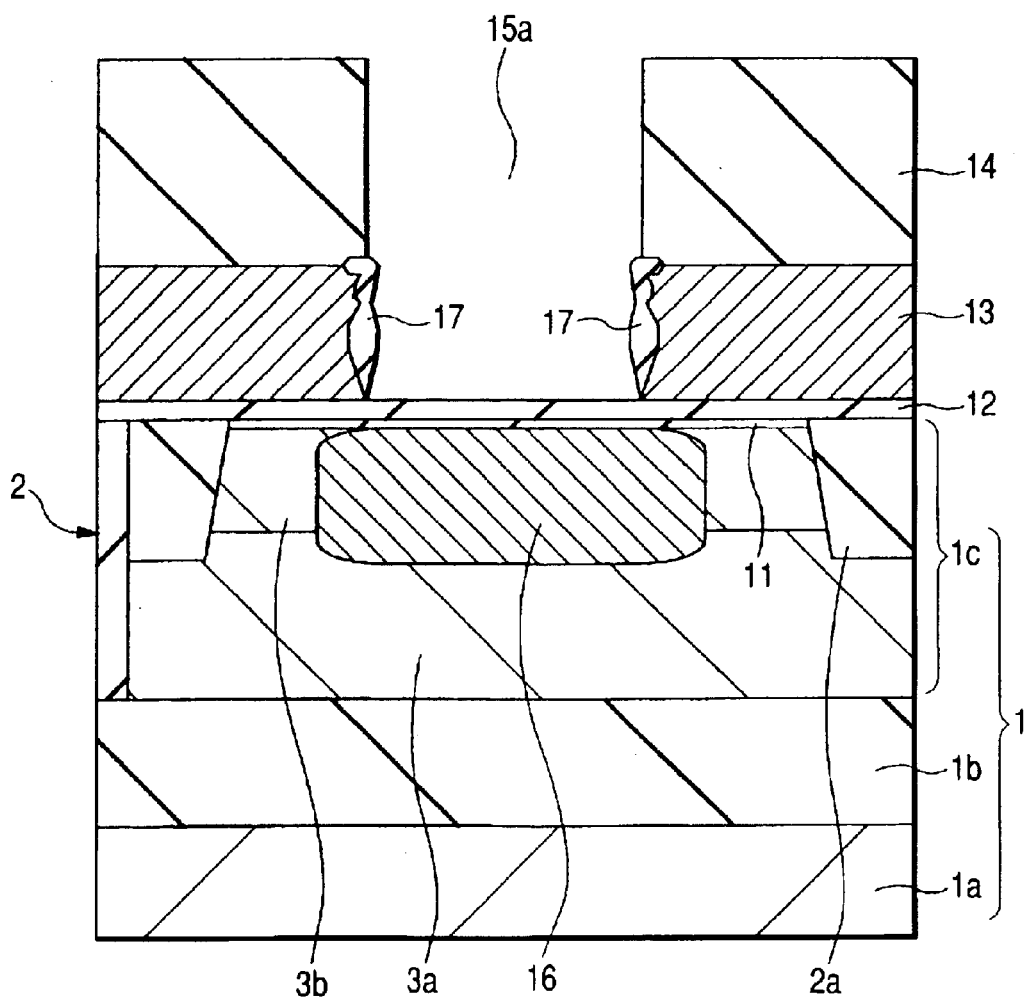
FIG. 13 is an enlarged fragmentary cross-sectional view of the bipolar transistor formation region after oxidation treatment following the step of FIG. 12.

The substrate 1 is then subjected to steam oxidation treatment (sidewall oxidation treatment). Here, oxidation of the substrate 1 is conducted, for example, for about 15 minutes at 700° C. in a 2:1 gas mixture of oxygen ($O_2$) and hydrogen ($H_2$). FIG. 13 is an enlarged fragmentary cross-sectional view of the HBT formation region after this oxidation step. By this oxidation, an insulating film 17 made of, for example, a silicon oxide film is formed on the inner side surface of the base electrode formation film 13 exposed inside of the first emitter opening portion 15a. This insulating film 17 serves as a protecting film (growth inhibiting film) upon selective epitaxial growth of the heterocrystalline layer which will be described later. When conventional oxidation treatment studied by the present inventors is employed, an oxidation rate at an upper corner (a shoulder portion; an intersect between the inner side surface of the base electrode formation film 13 inside of the first emitter opening portion 15a and the surface of the base electrode formation film 13 on which the insulating film 14 has been deposited) of the base electrode formation film 13 inside of the first emitter opening portion 15a becomes slower (in other words, is harder to oxidize) than that of the inner side surface of the base electrode formation film 13 so that the thickness of the protective film formed at the shoulder portion of the base electrode formation film 13 becomes thinner than that formed on the inner side surface of the base electrode formation film 13. The base electrode formation film 13 is therefore sometimes not protected sufficiently. If under such a state, washing with hydrofluoric acid is conducted just before the growth of the heterocrystalline layer, the shoulder portion of the base electrode formation film 13 is exposed and a heterocrystalline layer happens to grow from the exposed portion of the base electrode formation film 13 upon the below-described growth of a heterocrystalline layer. If washing with hydrofluoric acid is not conducted sufficiently and therefore, the surface on which a heterocrystalline layer is to be grown is not cleaned well in order to avoid the above-described problem, the heterocrystalline layer happens to be polycrystalline without becoming single crystalline. Heat treatment at relatively higher temperatures upon formation of the insulating film 17 may be considered as another countermeasure to maintain thickness of the protecting film, but a raise in the heat treatment temperature is accompanied with such problems that an impurity of the gate electrode 5G of MIS which has already been formed over the substrate 1, particularly, boron in the gate electrode of pMIS is diffused to the side of the semiconductor layer 1c via the gate insulating film or impurity distribution in the semiconductor regions 6a, 7a for source and drain of MIS falls outside of the designed value (including error). In Embodiment 1, on the other hand, as described using FIGS. 5 and 6, since an oxidation promoting atom (ex. boron difluoride) has been implanted into the upper layer portion of the base electrode formation film 13, the above-described oxidation treatment causes rapid oxidation at the shoulder portion of the base electrode formation film 13, leading to an increase in an oxidation rate at the shoulder portion. This makes it possible to thicken the insulating film 17 at the shoulder portion of the base electrode formation film 13. In other words, the insulating film 17 having a sufficient thickness can be formed at the shoulder portion of the base electrode formation film 13 inside of the first emitter opening portion 15a even at a relatively low oxidation treatment temperature. Washing treatment just before the growth of the heterocrystalline layer can therefore be conducted sufficiently, whereby occurrence of growth failure of the heterocrystalline layer can be controlled or prevented. Moreover, it is not necessary to increase the oxidation treatment temperature so that re-arrangement of the impurity distribution of MIS can be avoided and fluctuations or deterioration of the electrical properties (threshold voltage, etc.) of MIS can be prevented. When the insulating film 17 is formed by oxidation treatment, the manufacturing step becomes simpler and microfabrication can be promoted compared with the formation of the insulating film by deposition and etchback. Moreover, the insulating film 17 is formed by oxidation treatment without dry etching treatment so that the semiconductor layer 1c can be avoided from damage and crystallinity of the heterocrystalline layer which will be described later can be improved.

Figure 14:
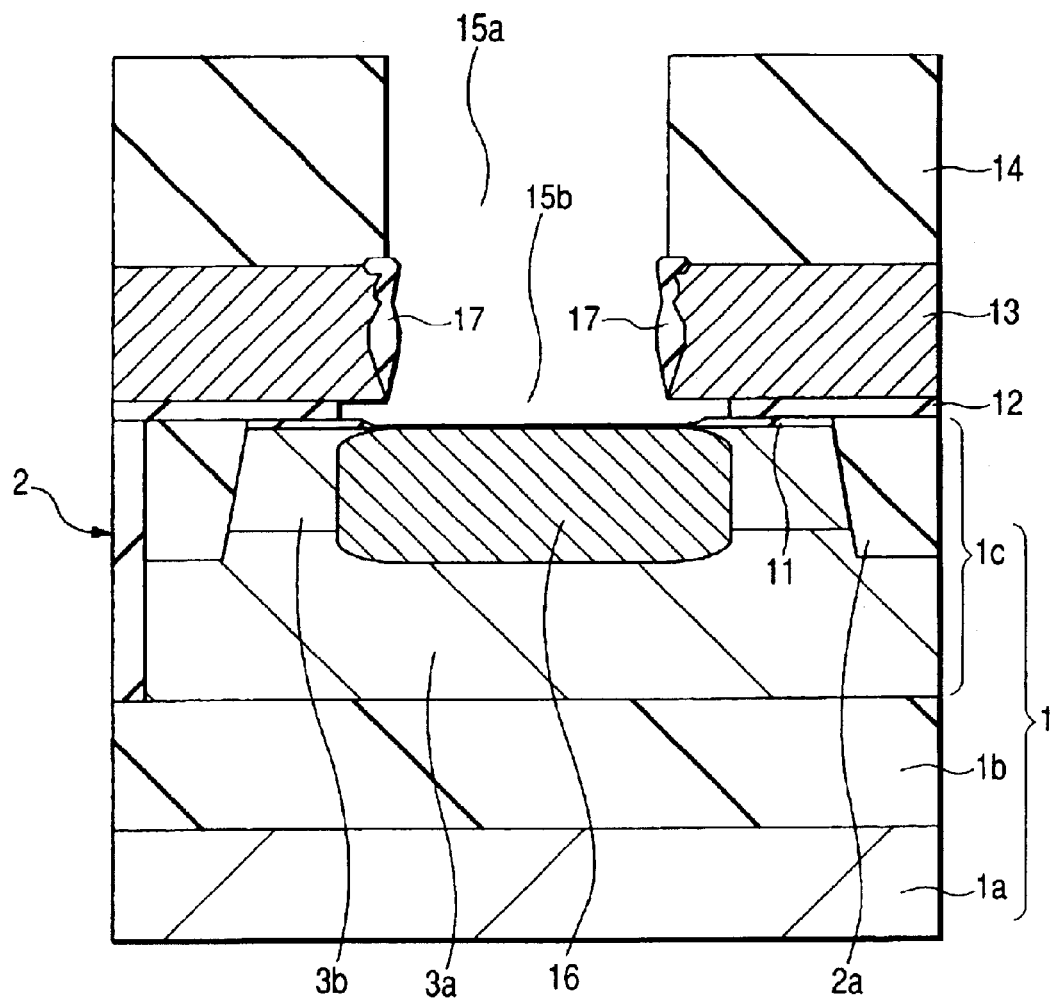
FIG. 14 is an enlarged fragmentary cross-sectional view of a bipolar transistor formation region during the manufacturing step of the semiconductor device following the step of FIG. 13.

FIG. 14 is an enlarged fragmentary cross-sectional view of the HBT formation region of the semiconductor device in its manufacturing step following that of FIG. 13. In this step, the insulating film 12 made of, for example, a silicon nitride film is removed from the bottom of the first emitter opening portion 15a by over-etching using, for example, hot phosphoric acid. Upon this removal, the insulating film 12 below the end portion of the base electrode formation film 13 is also removed partially by etching to form an undercut appears in the insulating film 12. The over-etching amount (undercut amount, that is, length of the semiconductor layer 1c in the direction along the main surface) is, for example, 60 nm. Upon this wet etching treatment with hot phosphoric acid, a difference in an etching rate between the silicon nitride film and silicon oxide film is about 30 so that even if an over-etching amount of the insulating film 12 made of a silicon nitride film is 60 nm, the etched amount of the insulating film 11 made of a silicon oxide film is about 2 nm. Accordingly, the main surface portion of the semiconductor layer 1c is protected from the wet etching by this insulating film 11 made of a silicon oxide film. By this wet etching treatment, a second emitter opening portion 15b having a planar size larger than that of the first emitter opening portion 15a is formed to communicate with the first emitter opening portion 15a therebelow. The second emitter opening portion 15b in this stage is opened in such a manner so that the side surface of the insulating film 12 is kept apart from the side surface of the base electrode formation film 13 inside of the first emitter opening portion 15a. The end portion of the base electrode formation film 13 looks like an appentice and a portion of the lower surface of the end portion of the base electrode formation film 13 is exposed from the second emitter opening portion 15b.

Figure 15:
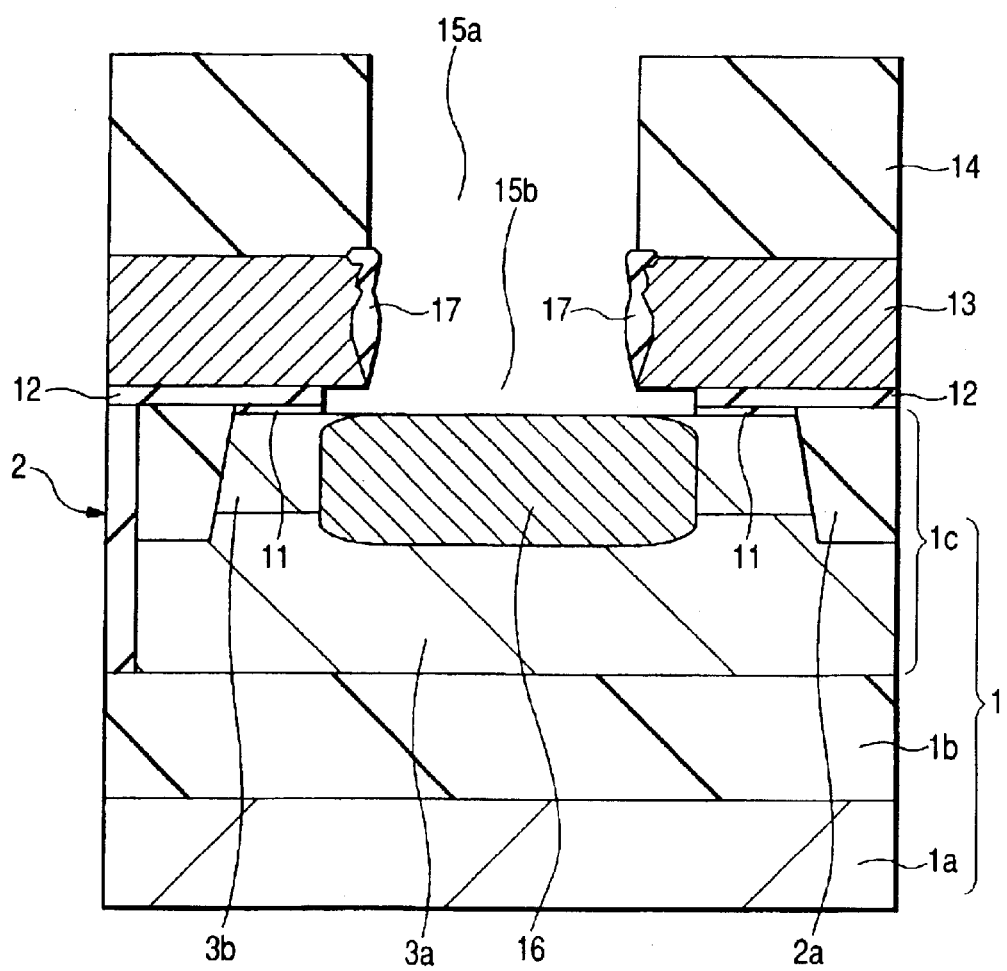
FIG. 15 is an enlarged fragmentary cross-sectional view of the bipolar transistor formation region after washing treatment following the step of FIG. 14.

The insulating film 11 exposed from the second emitter opening portion 15b is then removed by wet etching treatment (washing treatment) of the substrate 1 (SOI wafer) by using, for example, hydrofluoric acid. FIG. 15 is an enlarged fragmentary cross-sectional view of the HBT formation region after this washing treatment. By this removal, the hydrogen-terminated and chemically stable surface of the semiconductor layer 1c made of silicon can be exposed inside of the second emitter opening portion 15b. The insulating film 17 is removed by this washing treatment because it is, as the insulating film 11, made of a silicon oxide film, but the insulating film 17 is thicker than the insulating film 11 so that about 4 nm of it remains even after the washing treatment. In the conventional method as described above, sufficient washing treatment cannot be conducted because of a fear that the shoulder portion of the base electrode formation film 13 would be exposed by the above-described washing treatment owing to the thinness of the insulating film at the shoulder portion of the base electrode formation film 13. In this Embodiment 1, on the other hand, the insulating film 17 at the shoulder portion of the base electrode formation film 13 is formed thick and is not removed completely by the washing treatment so that the washing treatment can be conducted sufficiently. In this Embodiment 1, a hydrogen-terminated and chemically-stable silicon surface of the semiconductor layer 1c can be exposed more favorably so that the hydrogen terminating effect works more effectively upon subsequent growth of a heterocrystalline layer, leading to promotion of satisfactory crystal growth.

Figure 16:
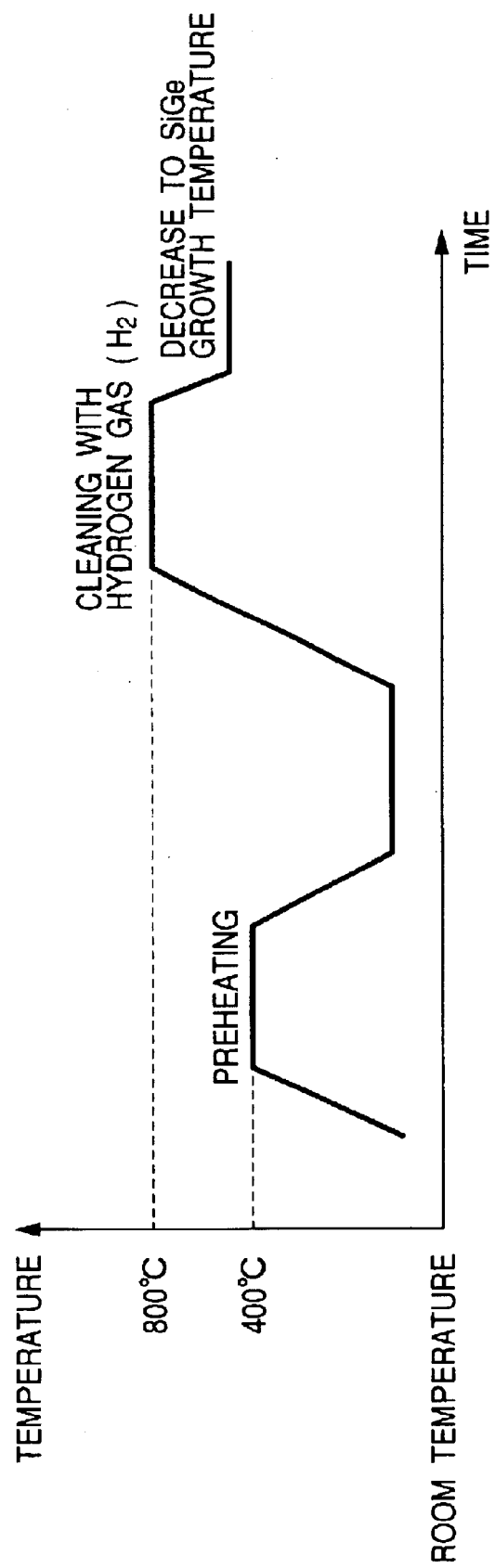
FIG. 16 is an explanatory view of heat treatment sequence after the step of FIG. 15.

Next, heat treatment is given in accordance with the treatment sequence shown in FIG. 16. Here, the substrate 1 (SOI wafer) placed in a heat treating chamber is subjected to preheat treatment (first heat treatment) in a reducing or non-oxidizing gas atmosphere such as hydrogen gas or nitrogen gas. For example, the lamp annealing method is employed for heating. The main purpose of this treatment is to sufficiently remove water from the substrate 1, particularly, from the insulating film 14. This treatment is conducted at at least a temperature permitting release of water but not greater than that breaking a silicon-hydrogen bond. The upper limit of the treating temperature is set out because if the temperature permits elimination of hydrogen from the silicon-hydrogen bond on the crystal growth surface, the silicon surface of the semiconductor layer 1c is re-oxidized by the water generated upon preheat treatment, thereby impairing the subsequent favorable crystal growth of a heterocrystalline layer. Thus, in this Embodiment 1, by heating the substrate 1 at a temperature not permitting release of hydrogen from the silicon-hydrogen bond while carrying out the washing treatment with hydrofluoric acid, thereby maintaining the hydrogen-terminated and stabilized surface of the semiconductor layer 1c inside the second emitter opening portion 15b on which surface a heterocrystalline layer will grow, it is possible to control or prevent re-oxidation of this surface of the semiconductor layer 1c, while removing water sufficiently. In this Embodiment 1, as shown in FIG. 9, the treating temperature is set out in consideration that the insulating film 14 formed by HDP-CVD shows a peak of water elimination distribution at around 300° C. Described specifically, water elimination from the insulating film 14 formed by HDP-CVD is observed at around 300° C. so that water contained in the insulating film 14 can be removed well by setting out the preheat treatment temperature at which its water elimination peak is observed. The preheat treatment temperature (first temperature) is, for example, about 100 to 400° C. It is conventionally known that a silicon-hydrogen bond is not broken at 400° C. or less. Then, the substrate 1 is taken out from the heating chamber, placed in a chamber of an apparatus for heteroepitaxial growth treatment, and then subjected to main heat treatment (second heat treatment) in a reducing gas atmosphere such as hydrogen gas. Also for this heat treatment, the lamp annealing method is employed. This heat treatment is called "reductive cleaning treatment" and is principally intended to remove the silicon oxide film over the surface on which a heterocrystalline layer is to be grown (main surface of the semiconductor layer 1c) mainly by reduction reaction to expose a clean silicon surface for the growth of the heterocrystalline layer. According to the technique studied by the present inventors, the main heat treatment temperature is set as high as about 850° C. to 1200° C. Such a high-temperature heat treatment however causes re-diffusion of an impurity of MIS already formed on the substrate 1, thereby changing or deteriorating the electrical properties of MIS. Particularly in pMIS of a CMIS circuit having a dual gate electrode structure, boron diffuses from the gate electrode 5G to the semiconductor layer 1c and happens to cause fluctuations in the threshold voltage of MIS. In addition, the diffused boron happens to cause re-diffusion of an impurity in the semiconductor region 6a of MIS. If the treatment temperature is lowered simply, however, the crystal growth surface cannot be cleaned sufficiently and the heterocrystalline layer becomes polycrystalline. By this Embodiment 1, on the other hand, the main heat treatment temperature can be lowered under the reducing gas atmosphere without damaging the crystallinity of the heterocrystalline layer. This owes to the following reasons: the insulating film 14 itself is formed by HDP-CVD to suppress water generation, sufficient washing with hydrofluoric acid prior to the heterocrystalline growth makes it possible to expose a clean (stable) silicon surface, and the exposed state of the clean (stable) silicon surface can be maintained because water removal by preheat treatment in advance makes it possible to reduce water generated by heat treatment in a reducing gas atmosphere and re-oxidation of silicon on the crystal growth surface can be suppressed or prevented. More specifically, main heat treatment temperature (second temperature) in the reducing gas atmosphere is, for example, 800° C. or less and heat treating time is 120 seconds or less. According to the finding as a result of the investigation by the present inventors, problems of re-arrangement of impurity distribution of MIS can be avoided when the main heat treatment temperature is 800° C. or less. By this Embodiment 1, it is therefore possible to improve performances and reliability of a CMIS circuit.

In this Embodiment 1, as described above, the preheat treatment chamber and main heat treatment chamber are separately disposed, which makes it possible to maintain cleanness of the crystal growth surface of the substrate 1, because water generated upon preheat treatment does not adversely affect upon main heat treatment. If there is no fear of such an adverse effect, preheat treatment and main heat treatment may be conducted in the same epitaxial growth chamber. FIG. 16 shows a decrease in the treatment temperature when the substrate 1 is carried to a transfer chamber after preheat treatment. When preheat treatment and main heat treatment are carried out in one chamber, the temperature may be changed from the preheat treatment temperature to the main heat treatment temperature without decreasing the preheat treatment temperature (or without decreasing it so much). The temperature in the transfer chamber for transferring the substrate from the preheat treatment chamber to the main treatment chamber (epitaxial growth apparatus) is decreased in this Embodiment 1, because the cleanness of the transfer chamber is lower than that of the heat treatment chamber and without a decrease in the temperature, the cleanness of the crystal growth surface will be deteriorated. When the transfer chamber has a structure capable of maintaining its cleanness, the temperature can be changed to main heat treatment temperature without lowering the preheat treatment temperature (or without lowering preheat treatment temperature so much).

Figure 17:
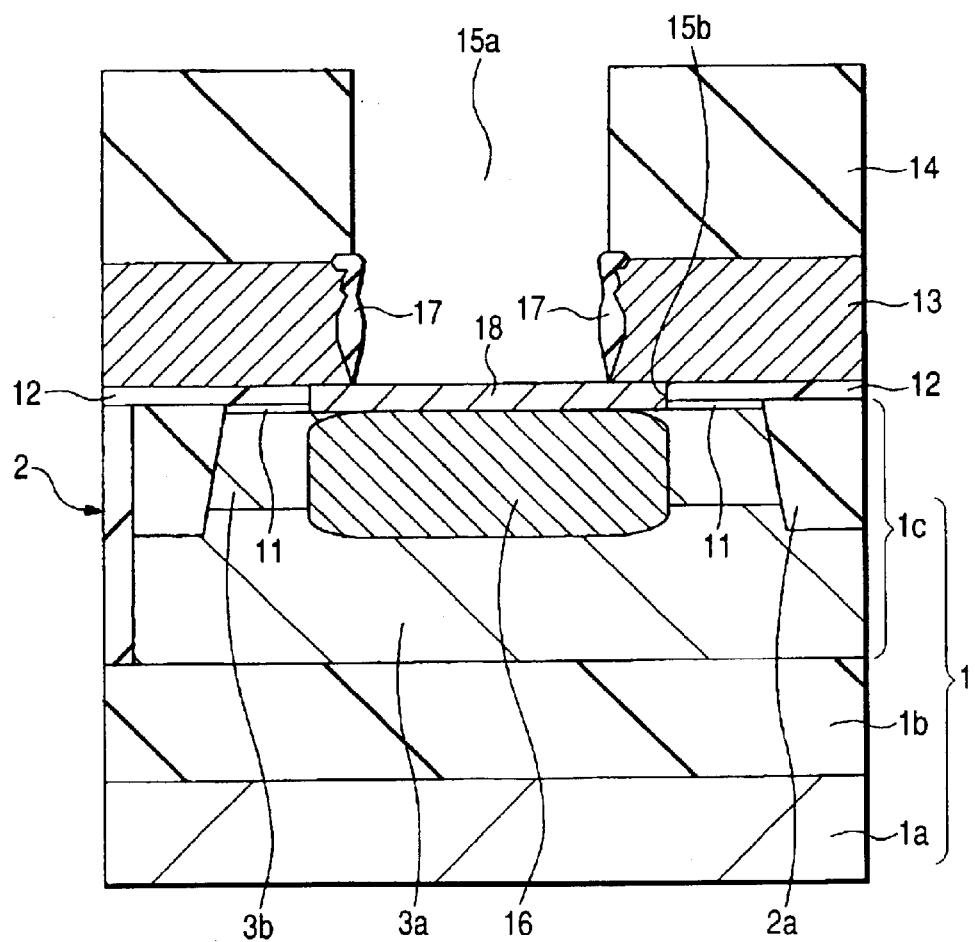
FIG. 17 is an enlarged fragmentary cross-sectional view of the bipolar transistor formation region after the step of FIG. 16.

In the treatment chamber of the above-described epitaxial growth apparatus, epitaxial growth of a heterocrystalline layer such as silicon-germanium (Si—Ge) is caused selectively on the semiconductor layer 1c of the substrate 1 (SOI wafer), for example, by LP-CVD (Low Pressure-Chemical Vapor Deposition). The temperature of this treatment is, for example, about 650 to 800° C. As described in FIG. 16, the temperature is adjusted to be lower than the heat treatment temperature in the reducing gas atmosphere. For selective SiGe growth, gases such as $SiH_2Cl_2$, $SiH_4$, HCl, $GeH_4$, $B_2H_6$ or $H_2$ is employed as a raw material gas. FIG. 17 is an enlarged fragmentary cross-sectional view of the HBT formation region after the heterocrystalline layer 18 is formed.

Figure 18:
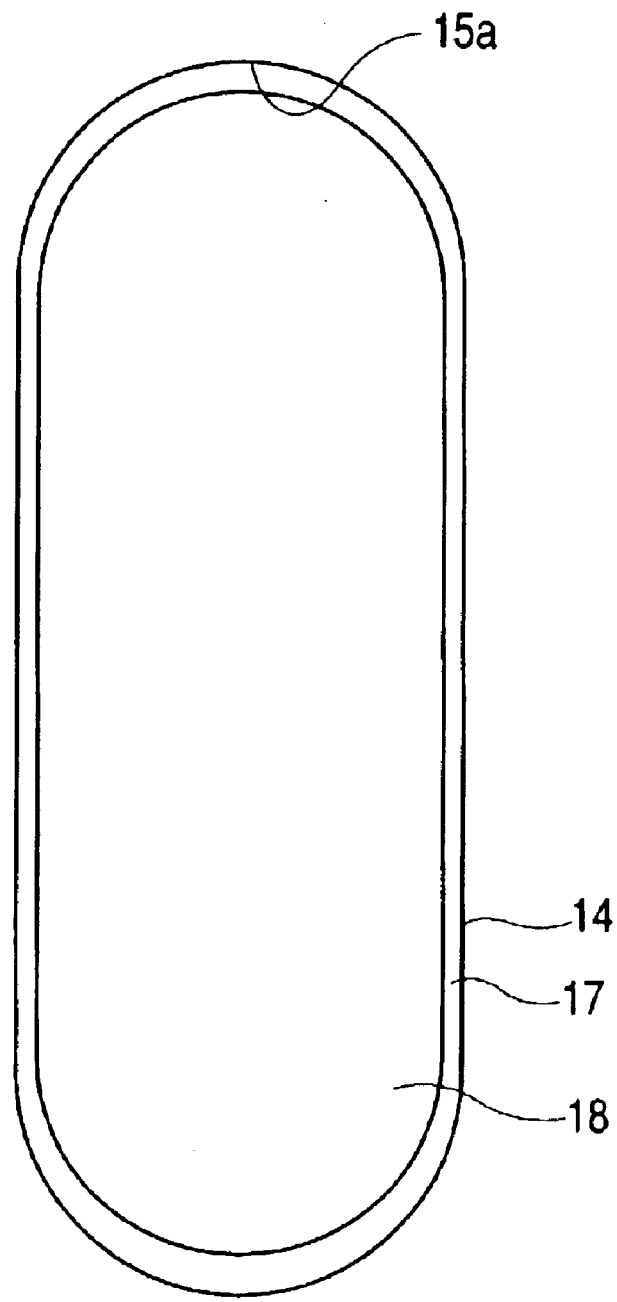
FIG. 18 is a fragmentary plane view of an HBT during its formation step, which HBT was investigated by the present inventors.

FIG. 18 is a fragmentary plane view of the HBT formation region of FIG. 17. The heterocrystalline layer 18 is a constituent forming the base region of an npn type HBT and it has, for example, i (intrinsic)-SiGe, p-type SiGe and i (intrinsic)-Si stacked one after another in this order. This p type SiGe has boron introduced therein and its concentration is about $2 \times 10^{19}$ cm$^{-3}$. This heterocrystalline layer 18 is formed to bury the second emitter opening portion 15b therewith and it is bonded to the lower surface of the end portion of the base electrode formation film 13 at the outer periphery of the second emitter opening portion 15b. Upon selective growth of this heterocrystalline layer 18, an impurity (boron) in the base electrode formation film 13 is diffused further until it reaches to the insulating film 12, whereby the base electrode formation film 13 is able to have a reduced resistance.

As a main component of the heterocrystalline layer 18, not only SiGe but various substances are usable. For example, the above-described Si or silicon-germanium-carbon (SiGeC) is usable. When Si is used, the heterocrystalline layer 18 is formed by causing i (intrinsic)-Si, p type Si and i (intrinsic)-Si to grow in the order of mention. When SiGeC is used, the heterocrystalline layer 18 is formed by causing i (intrinsic)-SiGeC, p type SiGeC and i (intrinsic)-Si to grow in the order of mention. The heterocrystalline layer 18 having an SiGe layer as the main component has improved cutoff frequency characteristics (fT) and current gain (hFE) compared with that using Si. When Si is used as the main component, temperature characteristics can be improved. That having an SiGeC layer has further improved cutoff frequency characteristics and current gain, because the concentration of Ge can be heightened compared with that having an SiGe layer.

Figure 19:
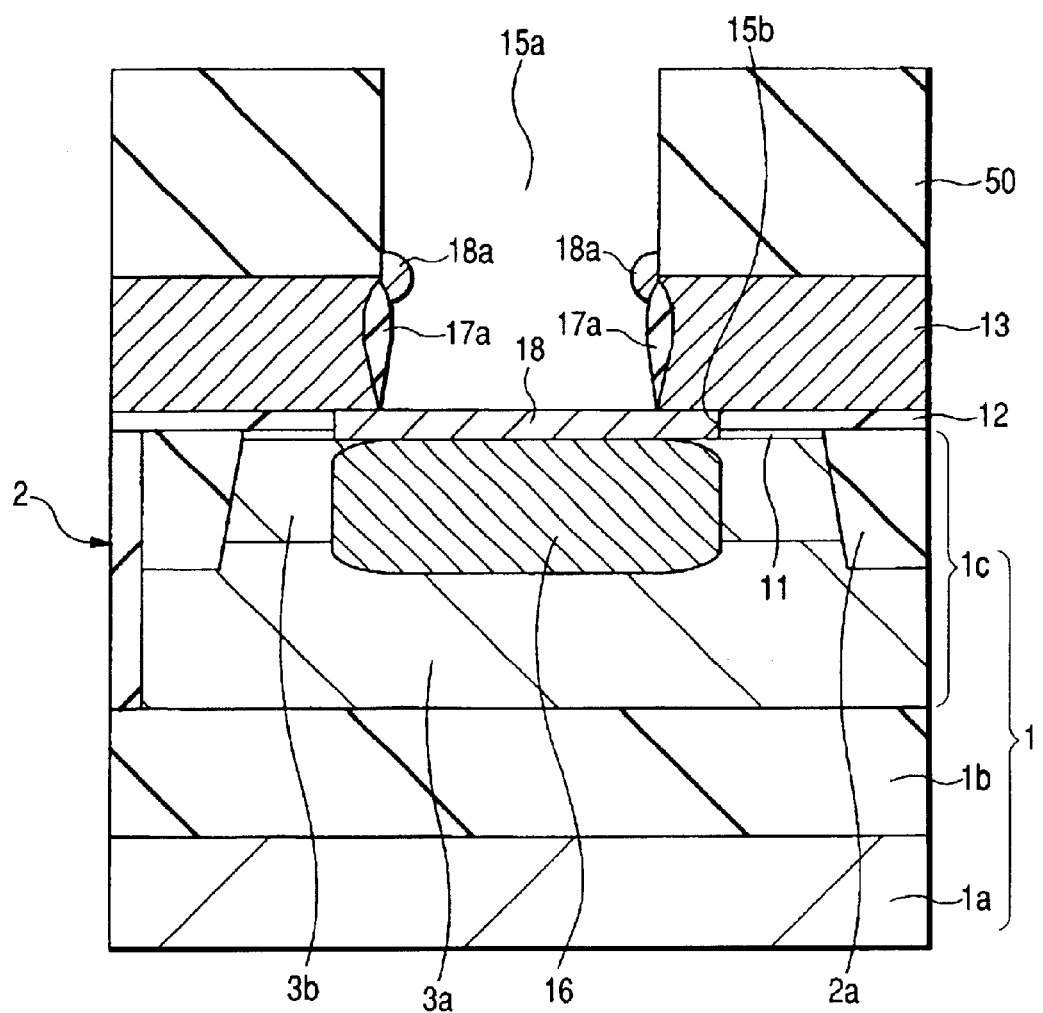
FIG. 19 is an enlarged fragmentary cross-sectional view of the HBT during its formation by the technique investigated by the present inventors.
Figure 20:
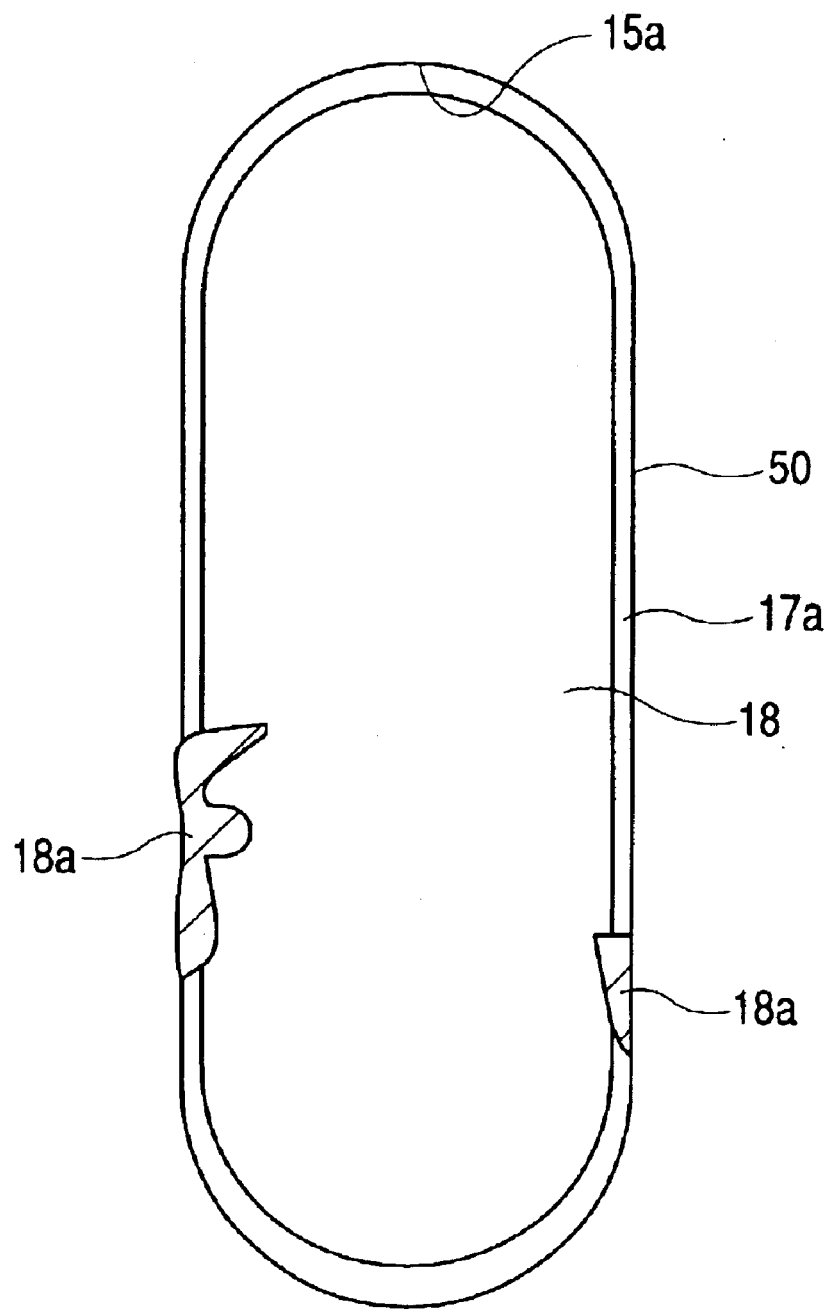
FIG. 20 is a plane view of FIG. 19.

In this Embodiment 1, even if the heat treatment temperature in a reducing gas atmosphere prior to the growth of a heterocrystalline layer is 800° C. or less as described above, crystal growth can be effected while maintaining the cleanness of the crystal growth surface of the heterocrystalline layer 18, which makes it possible to obtain the heterocrystalline layer 18 as a single crystalline layer and improve its crystallinity. The electrical properties and reliability of the HBT can therefore be improved. In addition, the shoulder portion of the first emitter opening portion 15a is covered fully by the insulating film 17 so that the inconvenience such as inevitable growth of the heterocrystalline layer 18 from the shoulder portion upon crystal growth can be prevented. FIG. 19 is an enlarged fragmentary view of the HBT during its formation by the technique investigated by the present inventors. This diagram is shown for comparison. FIG. 20 is a plane view of FIG. 19. Indicated at numeral 50 is an insulating film formed by the high-temperature low-pressure CVD method using an organic gas. The shoulder portion of the base electrode formation film 13 is not covered fully by the insulating film 17 inside of the first emitter opening portion 15a so that an unnecessary heterocrystalline layer 18a grows from the exposed shoulder portion. This unnecessary heterocrystalline layer 18a becomes a cause for short-circuit failure between base-emitter electrodes.

Figure 21:
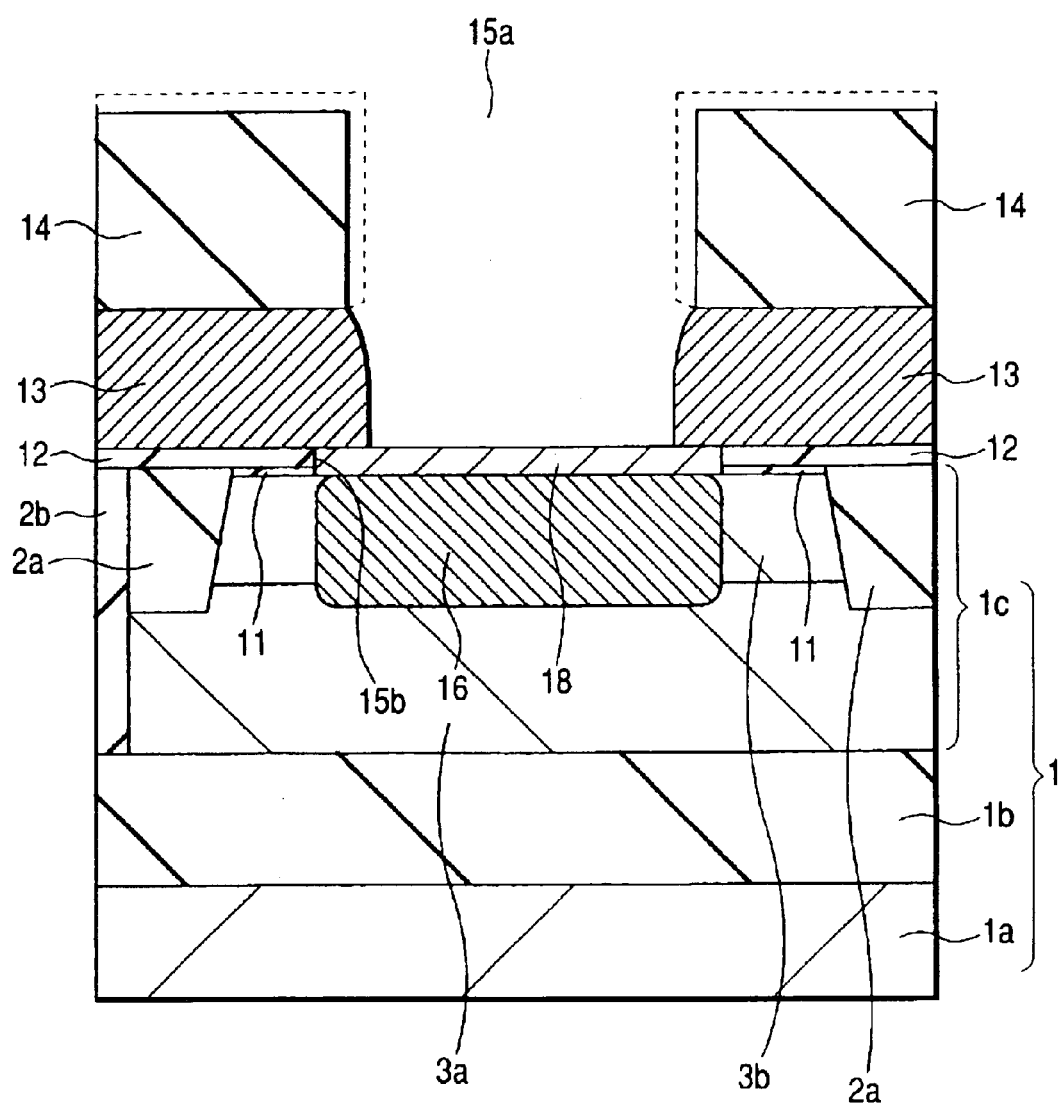
FIG. 21 is an enlarged fragmentary cross-sectional view of the bipolar transistor formation region after wet etching treatment following the step of FIG. 17.
Figure 22:
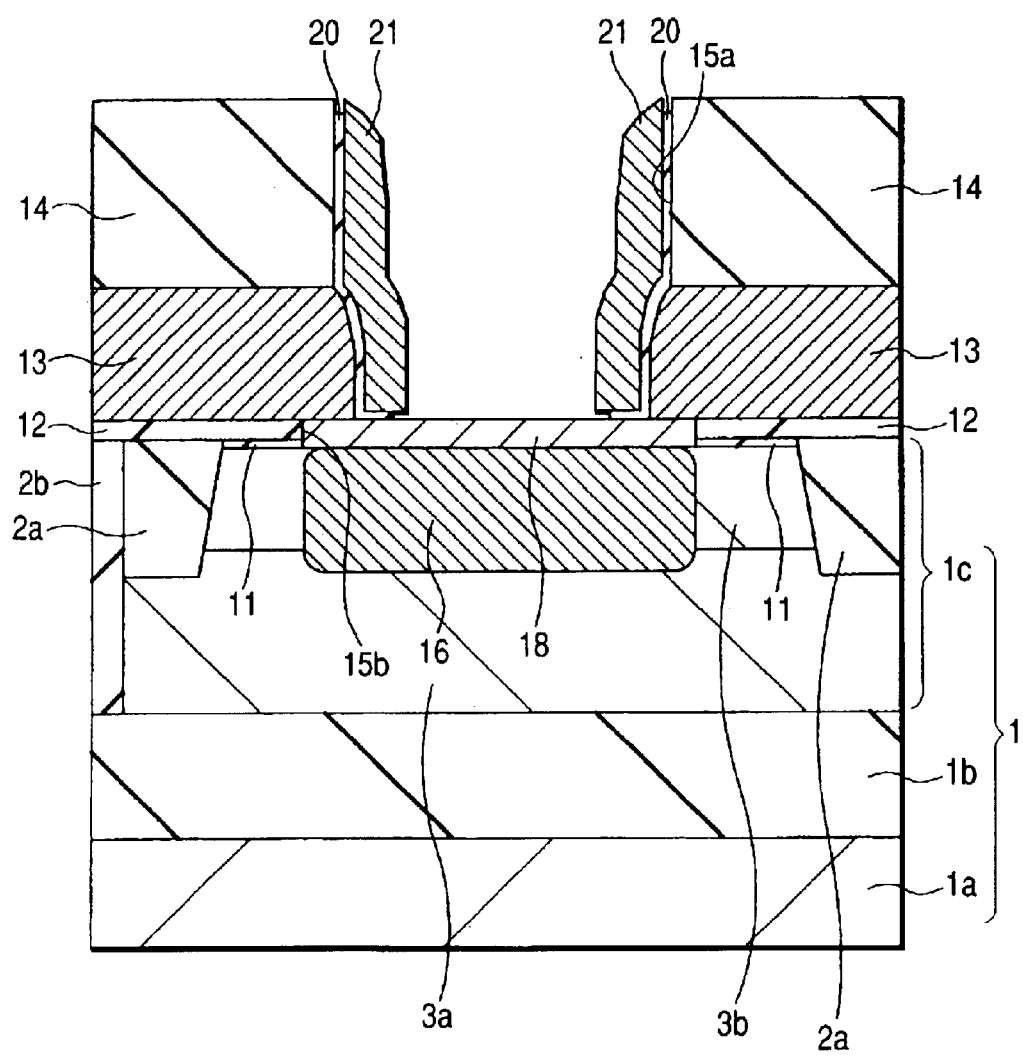
FIG. 22 is an enlarged fragmentary cross-sectional view of the bipolar transistor formation region after the step of FIG. 21.

Then, second ion implantation is carried out to form the SIC region 16. For example, phosphorus is implanted under conditions of about 70 KeV and $2 \times 10^{12}$ cm$^{-2}$. By this ion implantation, phosphorus is implanted into the semiconductor layer 1c and i-SiGe layer of the heterocrystalline layer 18. Then, the substrate 1 (SOI wafer) is wet etched with hydrofluoric acid to remove the insulating film 17. FIG. 21 is an enlarged fragmentary cross-sectional view of the HBT formation region after the wet etching. By this treatment, the shoulder portion of the base electrode formation film 13 is rounded to some extent. By this etching, the surface-layer portion of the insulating film 14 is also etched because the insulating film 14 over the base electrode formation film 13 is made of a silicon oxide film similar to the insulating film 17. A broken line in FIG. 21 shows an etched portion. The opening width of the first emitter portion 15a becomes wider upwards from the bottom. FIG. 22 is an enlarged fragmentary cross-sectional view of the HBT formation region after the step of FIG. 21. In this step, after an insulating film (fifth insulating film) 20 of about 30 nm thick which is made of a silicon oxide film and a conductor film (first emitter electrode formation film) 21 of about 80 nm thick which is made of a phosphorus-doped polycrystalline silicon film are deposited by CVD over the main surface of the semiconductor layer 1c of the substrate 1 in the order of mention, the conductor film 21 is etched back by dry etching under conditions of a relatively small power and the insulating film 20 is removed by wet etching using, for example, hydrofluoric acid to expose the heterocrystalline layer 18 from the first emitter opening portion 15a.

Figure 23:
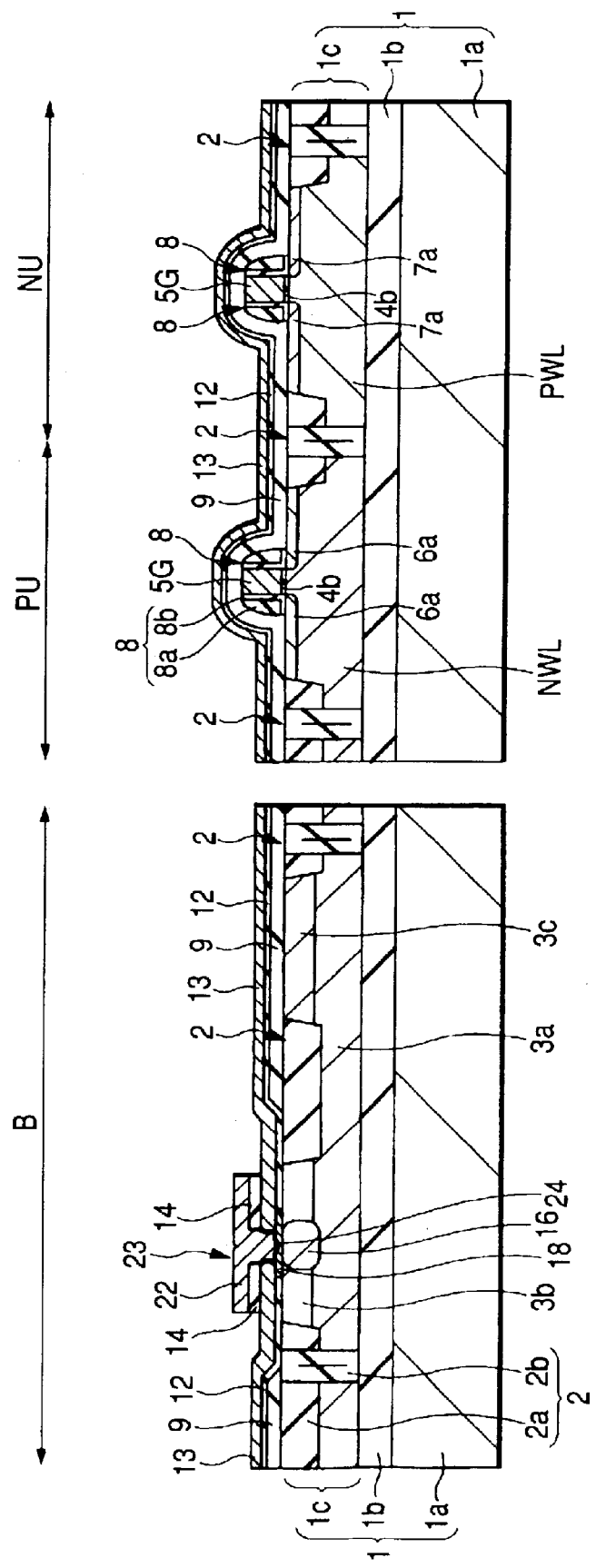
FIG. 23 is a fragmentary cross-sectional view of the semiconductor device after the step of FIG. 22.
Figure 24:
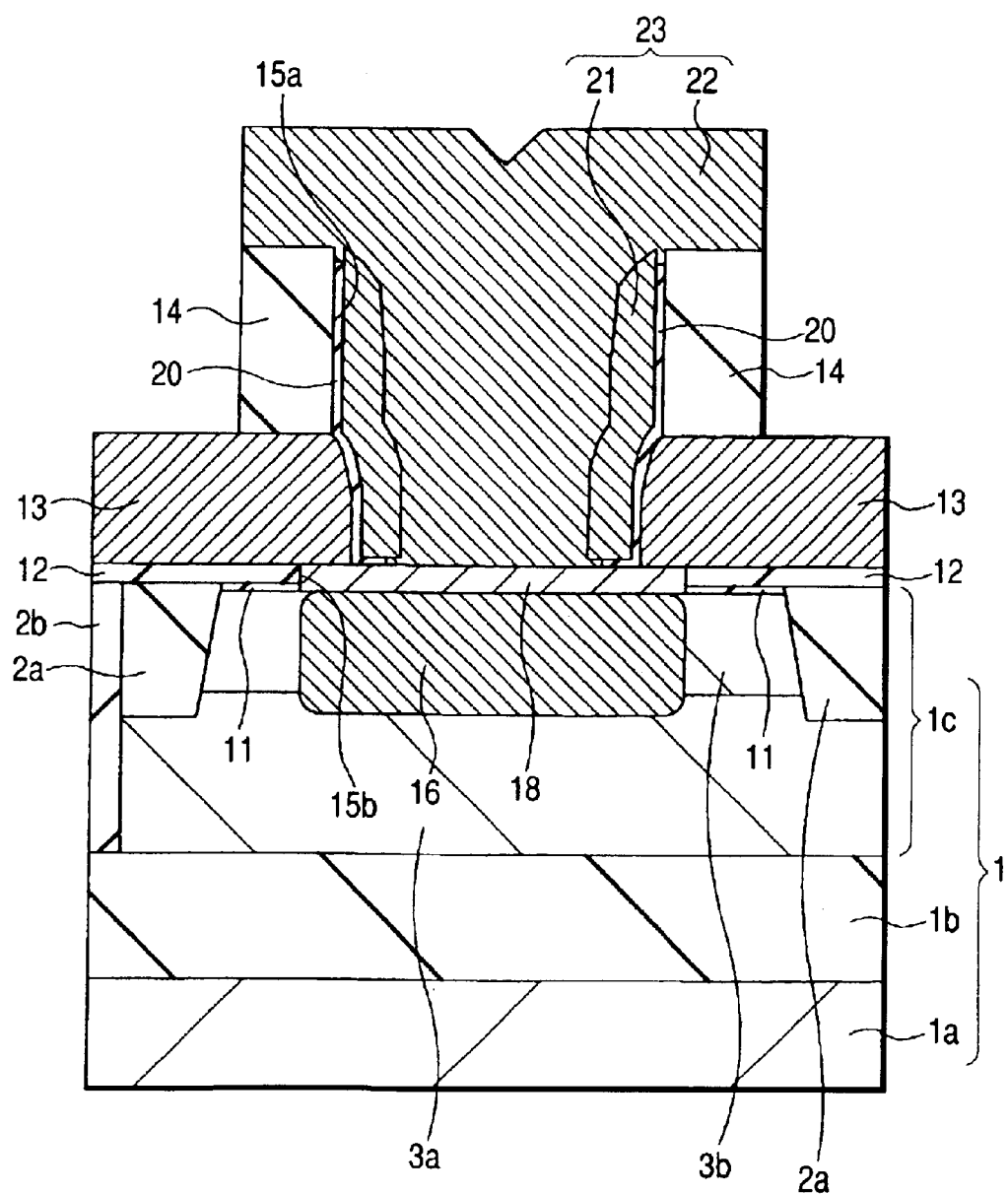
FIG. 24 is an enlarged fragmentary cross-sectional view of the bipolar transistor formation region after the step of FIG. 23.

FIG. 23 is a fragmentary cross-sectional view of a semiconductor device after the step of FIG. 22, while FIG. 24 is an enlarged fragmentary cross-sectional view of the HBT region of the step of FIG. 23. In this step, after a conductor film (second emitter electrode formation film) 22 of about 200 nm thick which is made of a phosphorus-doped polycrystalline silicon film is deposited over the main surface of the substrate 1 by CVD, the resulting conductor film 22 is patterned by lithography and dry etching, whereby an emitter electrode 23 is formed. The emitter electrode 23 has the above-described conductor films 21,22. The conductor film 22 of the emitter electrode 23 is brought in contact with the heterocrystalline layer 18 (that is, base region) on the bottom of the first emitter opening portion 15a. With the resist pattern used upon patterning of the emitter electrode 23 as an etching mask, the insulating film 14 is also etched to expose the base electrode formation film 13 lying thereunder. At this stage, the side surface of the pattern of the conductor film 22 of the emitter electrode 23 and the side surface of the insulating film 14 almost coincide each other as illustrated in FIG. 24. After removal of the resist pattern, the substrate 1 is wet etched lightly so that the side surface of the insulating film 14 left in the vicinity of the emitter electrode 23 retreats from the side surface of the emitter 23, in other words, to form an undercut on the side surface of the insulating film 14. By this removal by etching, the side surface of the pattern of the conductor film 22 of the emitter electrode 23 protrudes outside a little from the side surface of the insulating film 14.

Figure 25:
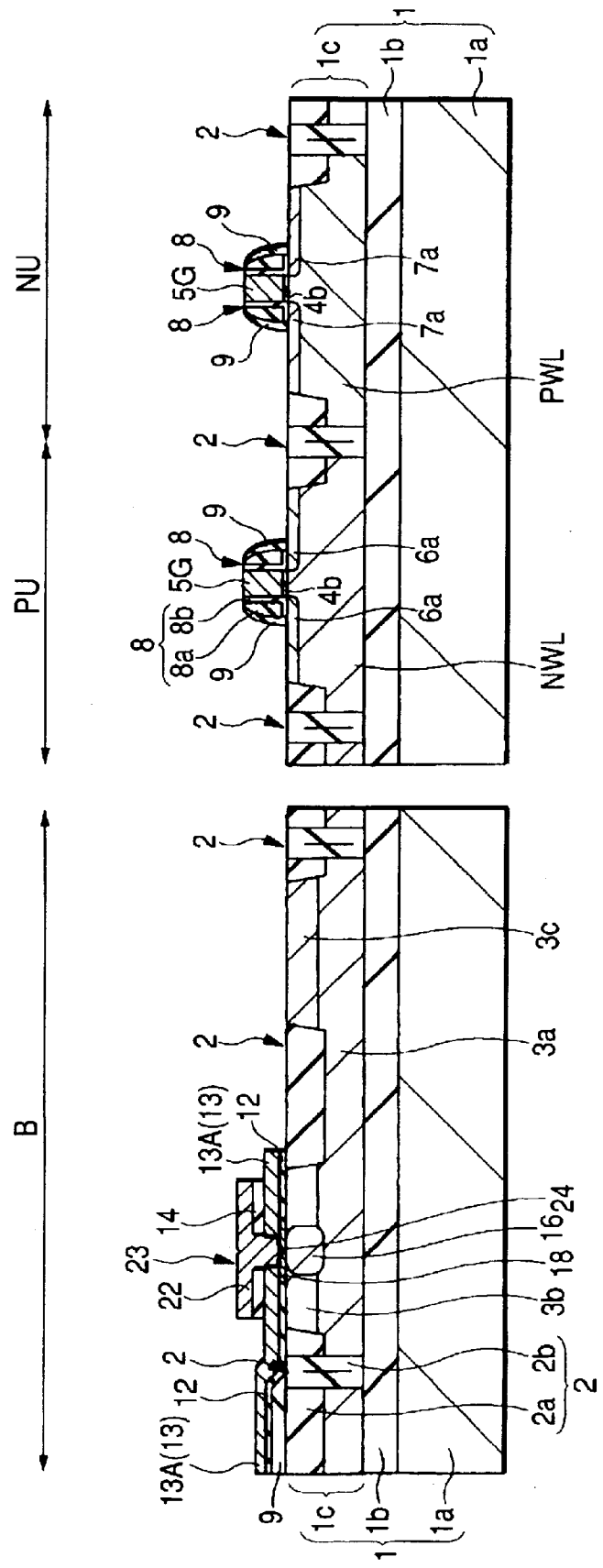
FIG. 25 is a fragmentary cross-sectional view of the semiconductor device after the step of FIG. 23.
Figure 26:
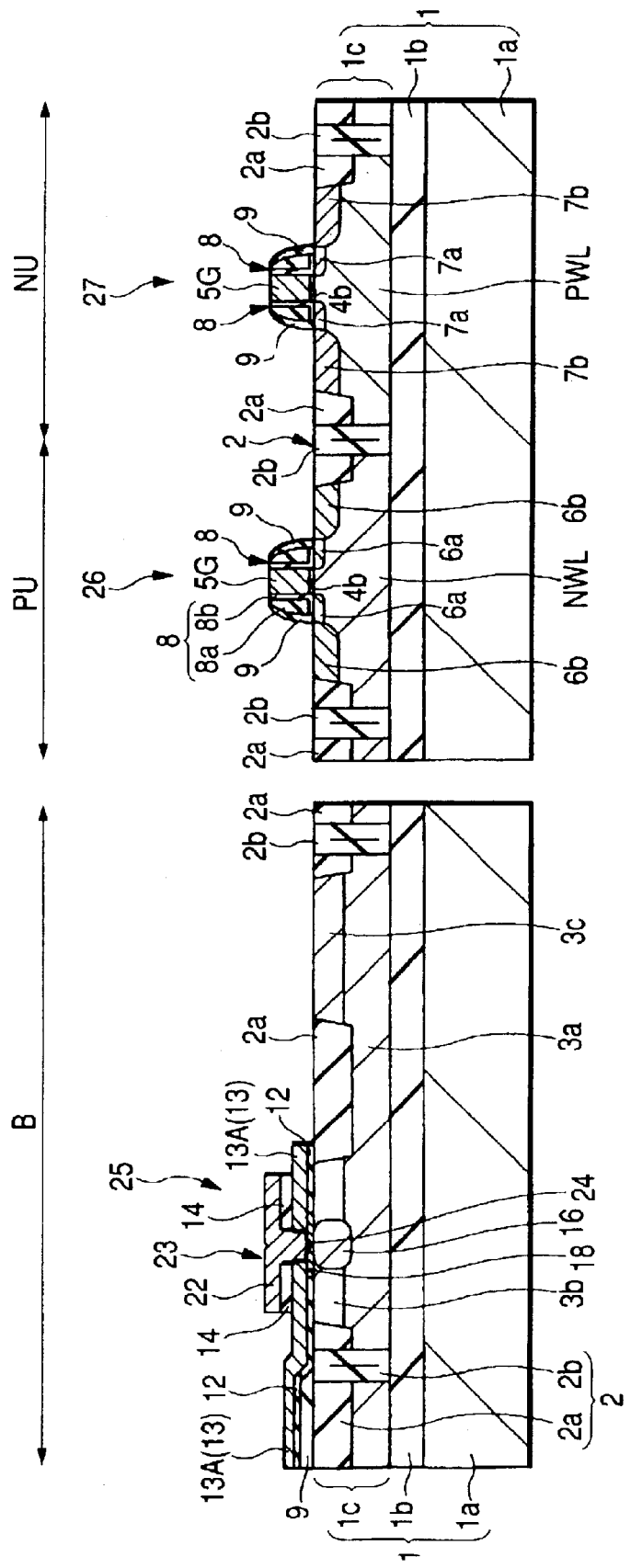
FIG. 26 is a fragmentary cross-sectional view of the semiconductor device after the step of FIG. 25.
Figure 27:
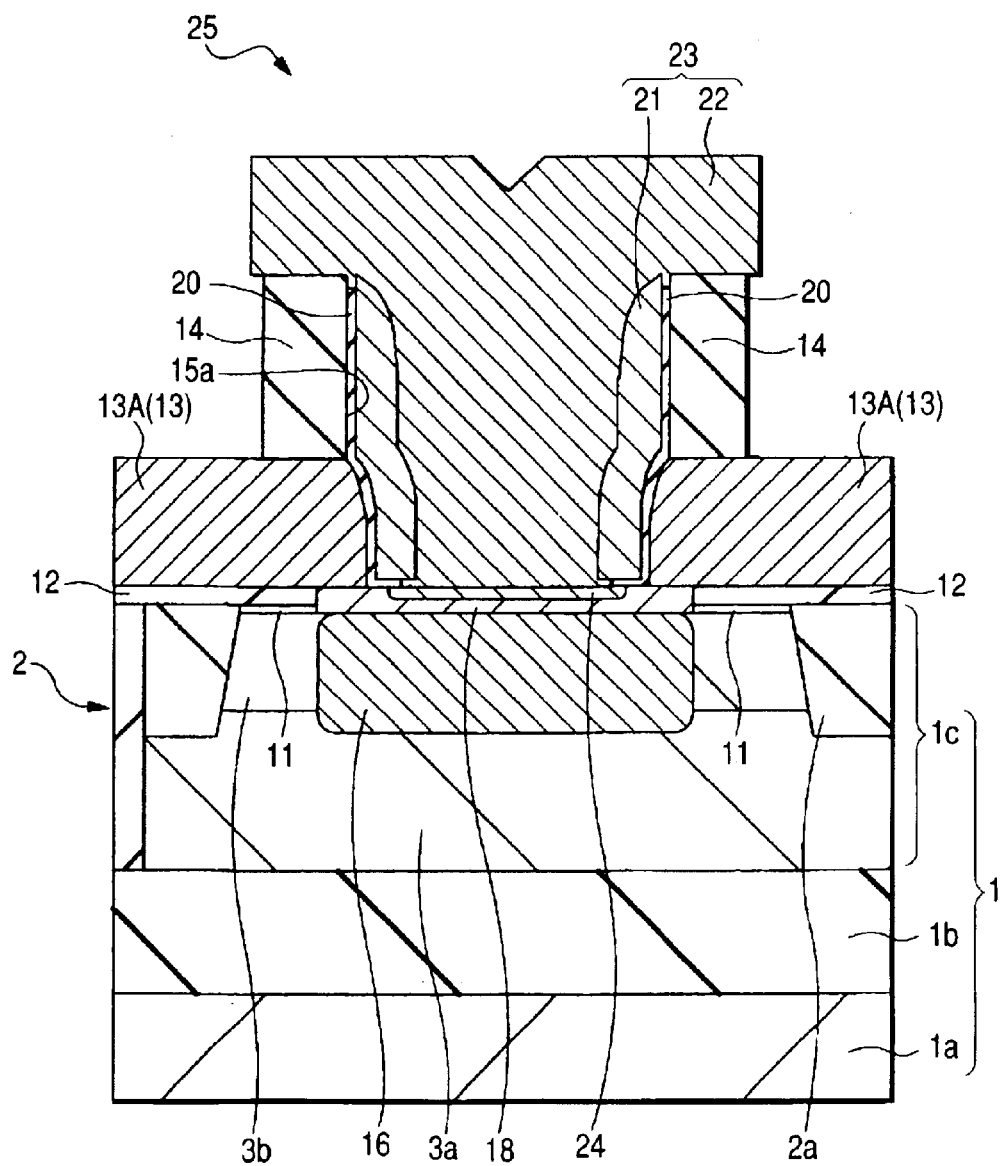
FIG. 27 is an enlarged fragmentary cross-sectional view of the bipolar transistor formation region after the step of FIG. 26.
Figure 28:
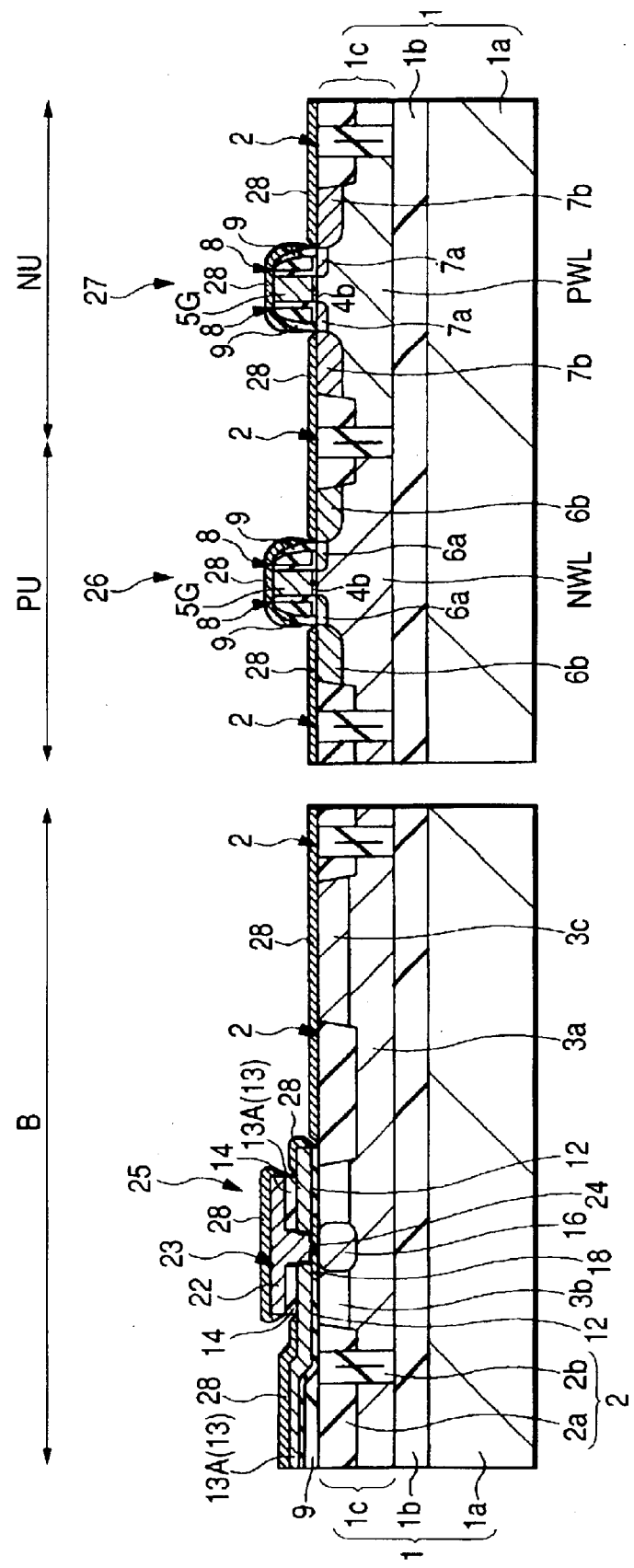
FIG. 28 is a fragmentary cross-sectional view of the semiconductor device after the step of FIG. 26.
Figure 29:
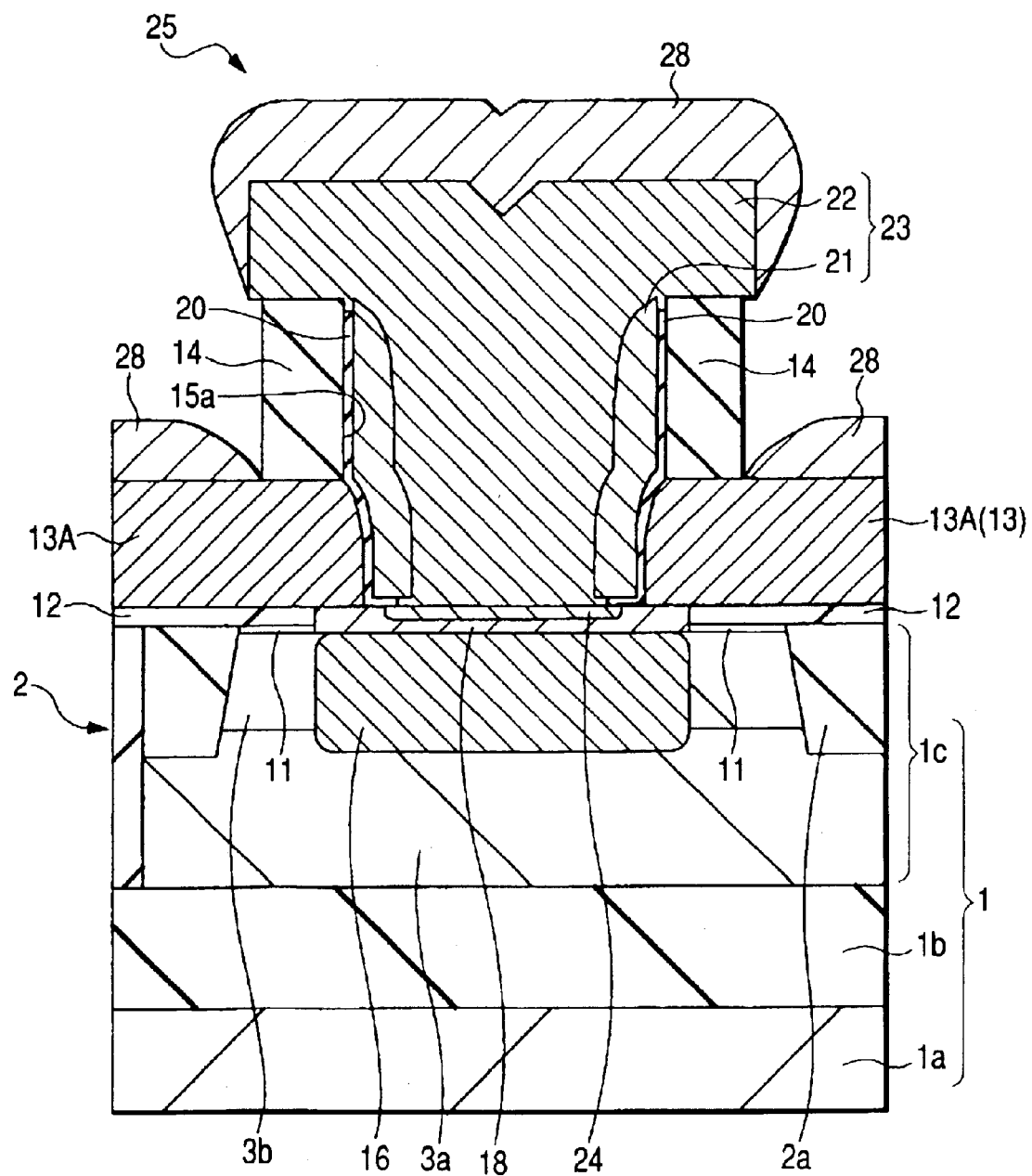
FIG. 29 is an enlarged fragmentary cross-sectional view of the bipolar transistor formation region after the step of FIG. 28.
Figure 30:
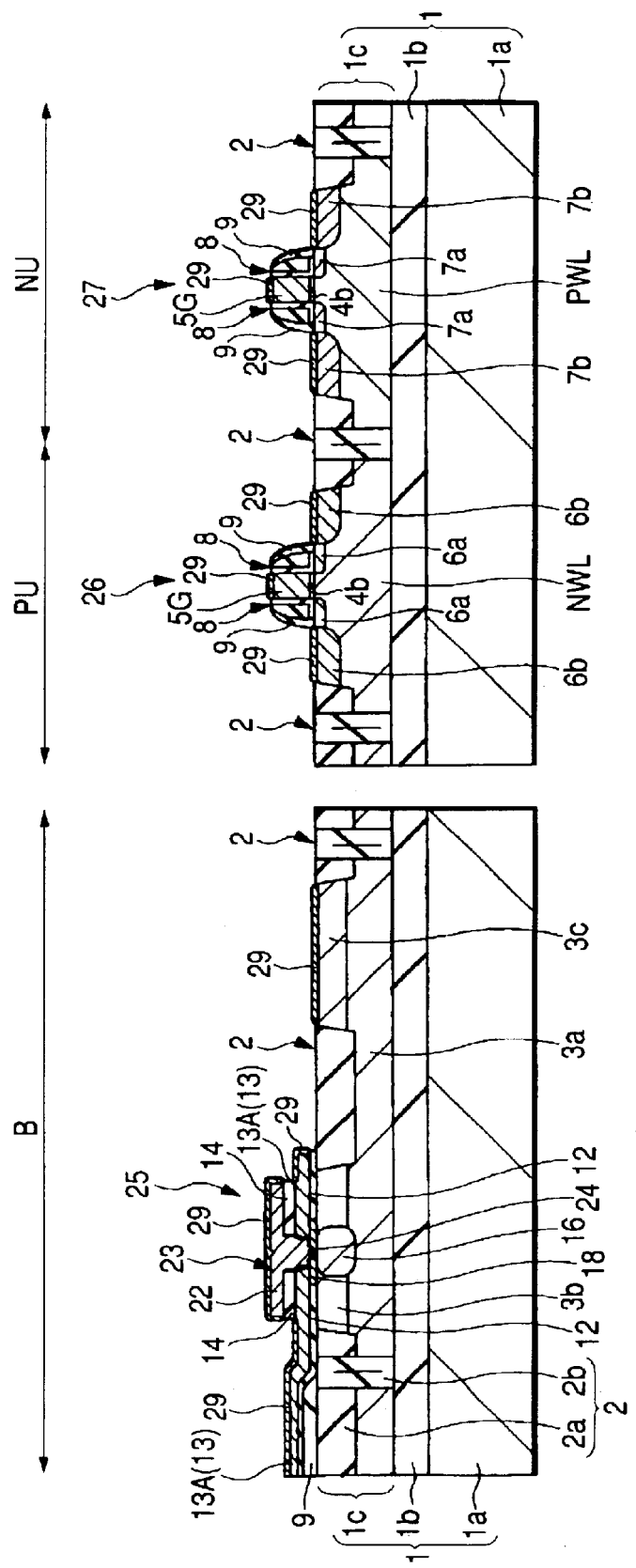
FIG. 30 is a fragmentary cross-sectional view of the semiconductor device after the step of FIG. 28.
Figure 31:
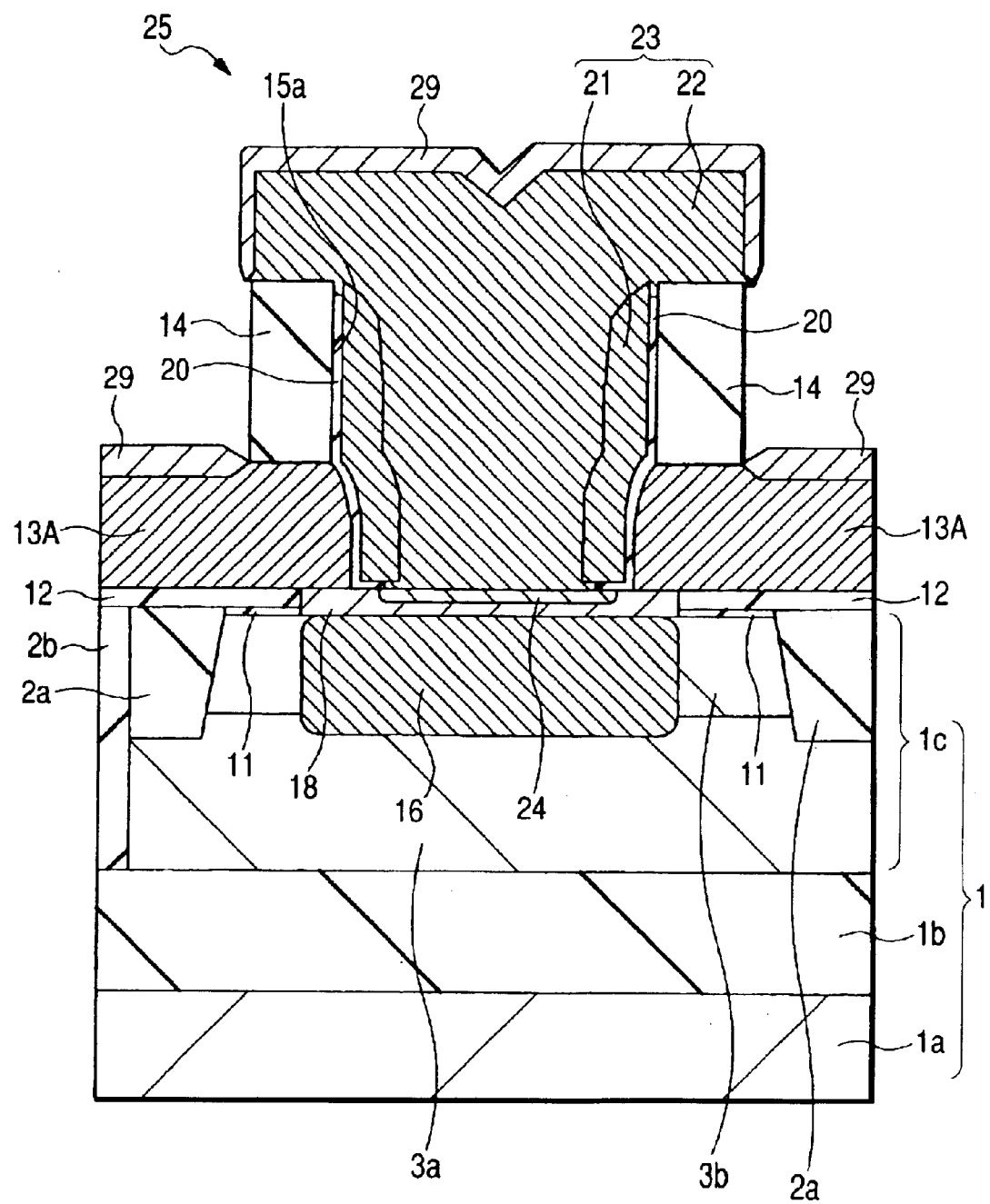
FIG. 31 is an enlarged fragmentary cross-sectional view of the bipolar transistor formation region after the step of FIG. 30.
Figure 32:
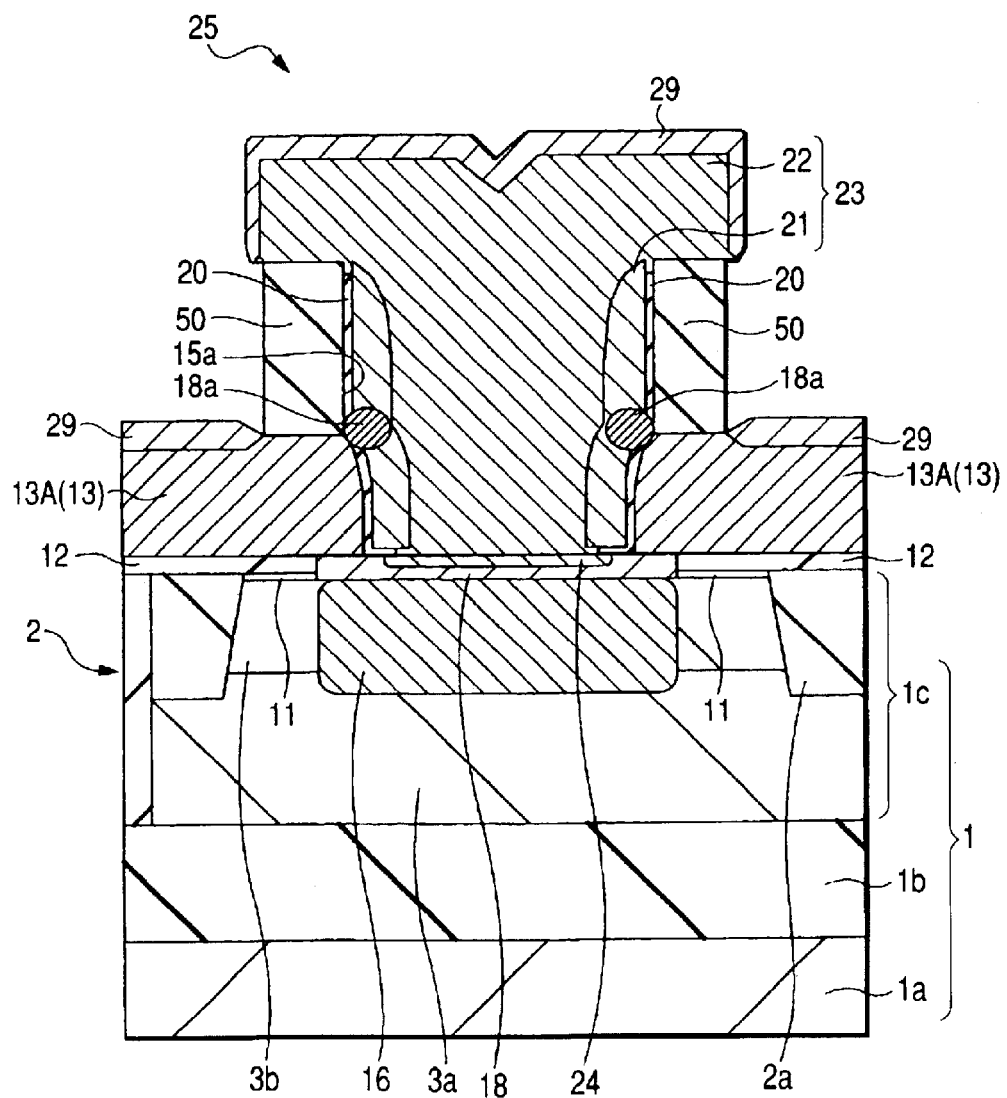
FIG. 32 is a fragmentary cross-sectional view of the bipolar transistor when its formation is continued while maintaining the state of FIG. 19.
Figure 33:
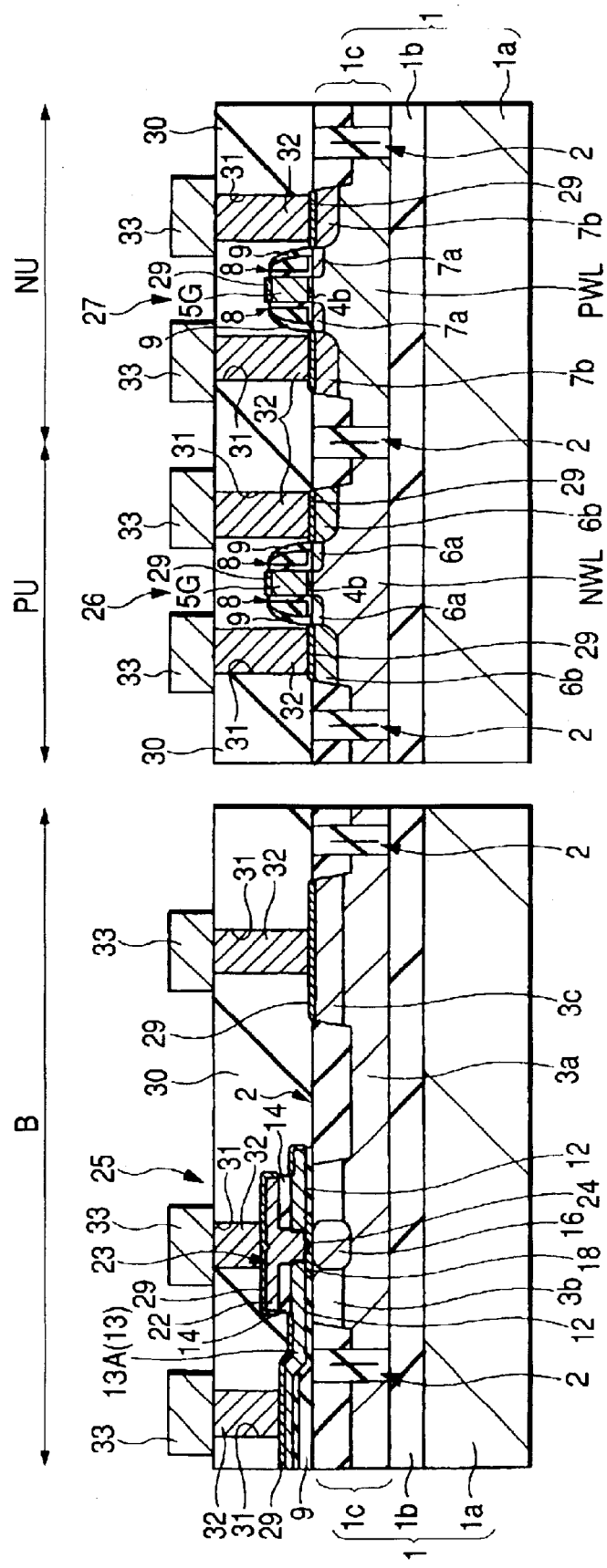
FIG. 33 is a fragmentary cross-sectional view of the semiconductor device after the step of FIG. 30.

FIG. 25 is a fragmentary cross-sectional view of the semiconductor device after the step of FIG. 23. In this step, after formation of a base electrode 13A by patterning the base electrode formation film 13 by lithography and dry etching, the insulating film 9 is etched back by anisotropic dry etching. At this time, the insulting film 9 remains on the side surface of the side walls 8 of the gate electrode 5G. Then, a resist pattern is formed to expose the nMIS formation region NU and cover the other region, an ion, for example, arsenic is implanted to the semiconductor layer 1c of the nMIS formation region NU in order to form n$^+$ type semiconductor regions for source and drain of nMIS. After formation of a resist pattern to expose the pMIS formation region PU and cover the other region, an ion, for example, boron difluoride is implanted to the pMIS formation region PU in order to form p$^+$ type semiconductor regions for the source and drain of the pMIS. FIG. 26 is a fragmentary cross-sectional view of the semiconductor device after the step of FIG. 25. FIG. 27 is an enlarged fragmentary cross-sectional view of the HBT formation region of FIG. 26. In this step, an emitter region 24 is formed on the upper portion (a region in contact with the conductor film 22) of the heterocrystalline layer 18 by heat treating the substrate 1 (SOI wafer), for example, at 950° C. for 2 seconds, thereby diffusing phosphorus of the conductor layer 22 to the i-Si layer of the heterocrystalline layer 18. By this, HBT 25 is formed. At this time, the impurities implanted in the pMIS formation region PU and nMIS formation region NU are activated simultaneously to form $p^+$ type semiconductor region (second semiconductor region) 6b and $n^+$ type semiconductor region (second semiconductor region) 7b, whereby pMIS 26 and nMIS 27 are formed. FIG. 28 is a fragmentary cross-sectional view of the semiconductor device after the step of FIG. 26 and FIG. 29 is an enlarged fragmentary cross-sectional view of the HBT formation region of FIG. 28. In this step, after exposure of the surfaces of the base electrode 13A, emitter electrode 23, $n^+$ type collector extraction region 3c, p type semiconductor region 6a, n type semiconductor region 7b and gate electrode 5G, a conductor film 28 of about 40 nm thick made of, for example, titanium (Ti) or cobalt (Co) is deposited over the main surface of the substrate 1 (SOI wafer) by sputtering. Sputtering is highly directional so that the conductor film 28 cannot be adhered to the side surfaces of each member over the substrate 1. Particularly in this Embodiment 1, since the side surfaces of the insulating film 14 are undercut a little and the emitter electrode 23 has an appentice at both ends thereof, the conductor film 28 does not adhere to the side surfaces of the insulating film 14. FIG. 30 is a fragmentary cross-sectional view of the semiconductor device after the step of FIG. 28 and FIG. 31 is an enlarged fragmentary cross-sectional view of the HBT formation region of FIG. 30. In this step, after formation of a silicide layer 29 made of, for example, titanium silicide ($TiSi_x$) or cobalt silicide ($CoSi_x$) on the surfaces of the base electrode 13A, emitter electrode 23, $n^+$ type collector extraction region 3c, p type semiconductor region 6a, n type semiconductor region 7b and gate electrode 5G by subjecting the substrate 1 to first heat treatment at 500° C. for about 60 seconds, for example, in a nitrogen gas ($N_2$) atmosphere, an unreacted portion of the conductor film 28 is removed by wet etching. A composition ratio x of silicon and a metal in the silicide is called stoichiometry and depending thereon, the properties of the silicide vary. The composition ratio x is usually about 2. Then, the resistance of the silicide layer 29 is lowered by subjecting the substrate 1 to second heat treatment at about 740° C. for 93 seconds in a nitrogen gas ($N_2$) atmosphere. FIG. 32 illustrates, for comparison, the HBT formation region when its formation is continued without changing the states of FIG. 19 and FIG. 20. In this case, the emitter electrode 23 and base electrode 13A are electrically connected via the heterocrystalline layer 18a which has grown from the shoulder portion of the base electrode 13A inside of the first emitter opening portion 15a. FIG. 33 is a fragmentary cross-sectional view of the semiconductor device after the step of FIG. 30. In this step, after deposition of an insulating film made of, for example, a silicon oxide film over the substrate 1 (SOI wafer) by CVD or coating method, or both thereof, the upper surface of the insulating film is polished by CMP (Chemical Mechanical Polish) to planarize it to form an interlayer insulating film 30. Then, a contact hole 31 is made in the interlayer insulating film 30. After deposition of a relatively thin conductor film made of, for example, a laminate film of titanium and titanium nitride, a relatively thick conductor film made of, for example, tungsten is deposited, followed by polishing by CMP (Chemical Mechanical Polish) to form a plug (interconnect) 32 in the contact hole 31. Over the plug 32 and interlayer insulating film 30, a conductor film composed mainly of aluminum or aluminum alloy is deposited by sputtering, and it is then patterned by lithography and dry etching to form a first interlevel interconnect (interconnect) 33. To the steps thereafter, conventional manufacturing steps of a semiconductor device will be applied to fabricate a semiconductor device having a bipolar transistor and MIS.

Figure 34:
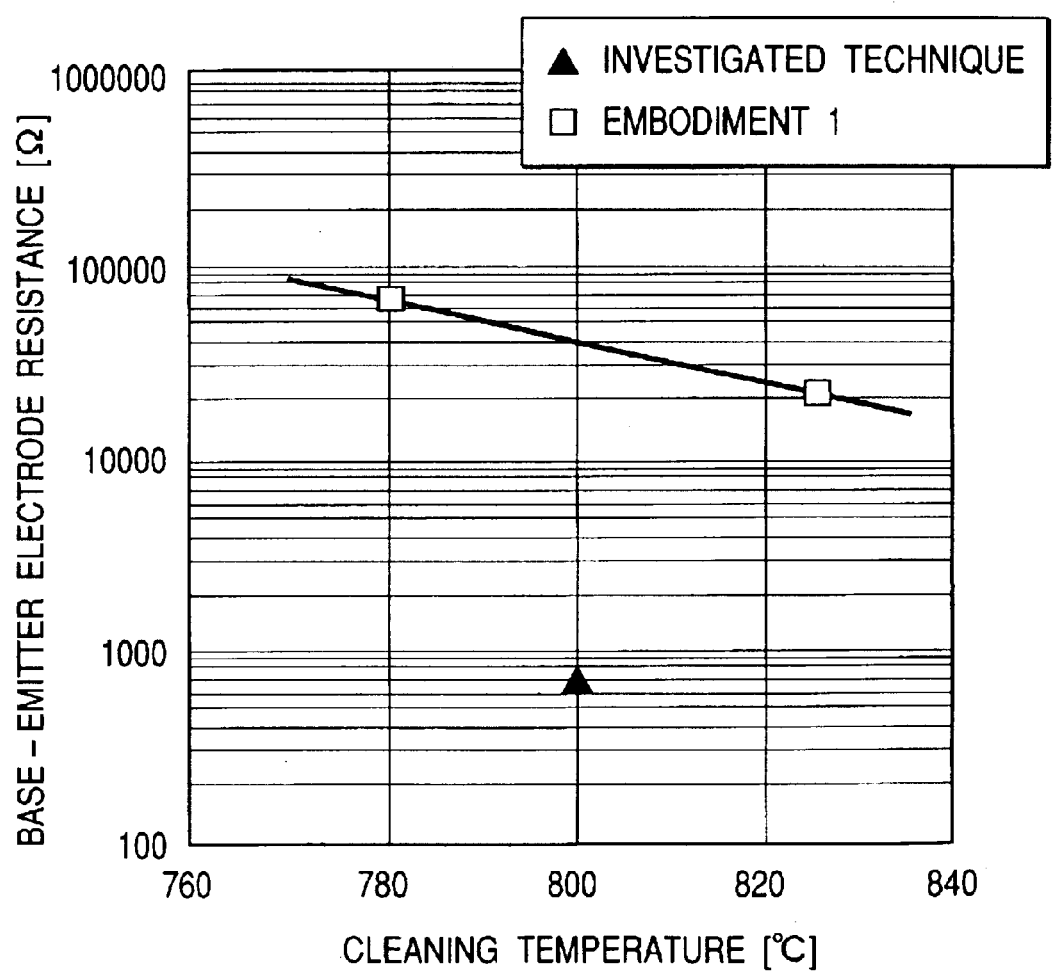
FIG. 34 is a graph illustrating the relationship between a heat treatment temperature in a reducing gas atmosphere and base-emitter electrode resistance of bipolar transistor which relationship is compared between this Embodiment and the technique investigated by the present inventors.

FIG. 34 is a graph illustrating the relationship between the heat treatment temperature in the reducing gas atmosphere and base-emitter electrode resistance of HBT which relationship is compared between Embodiment 1 (blank square) and the technique (solid triangle) investigated by the present inventors. When the base-emitter electrode resistance at heat treatment temperature of 800° C. in a reducing gas atmosphere is compared between Embodiment 1 and the technique investigated by the present inventors, the base-emitter electrode resistance of the former one can be made higher by at least two orders of magnitude than the latter technique. This suggests that in Embodiment 1, no useless heterocrystalline layer 18a is formed and the base electrode 13A of HBT is highly insulated from the emitter electrode 23.

Figure 35:
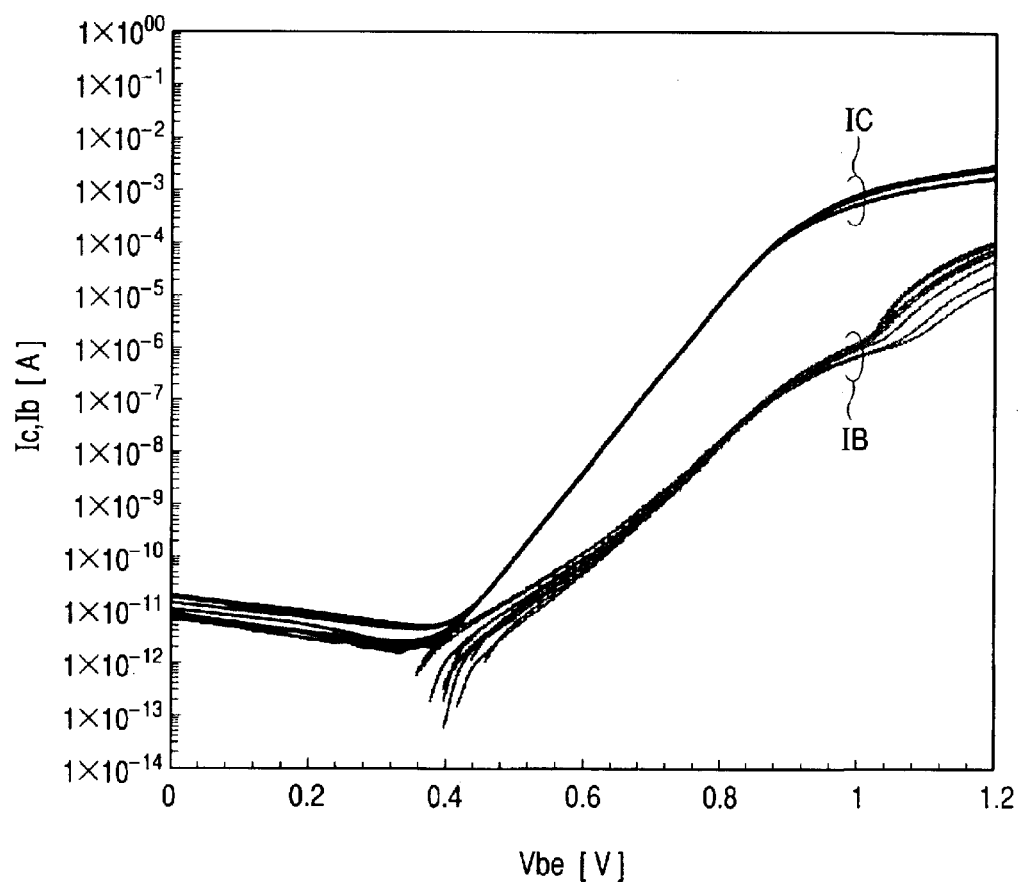
FIG. 35 is a graph of a base current and collector current relative to a base-emitter voltage of the bipolar transistor according to one embodiment of the present invention.
Figure 36:
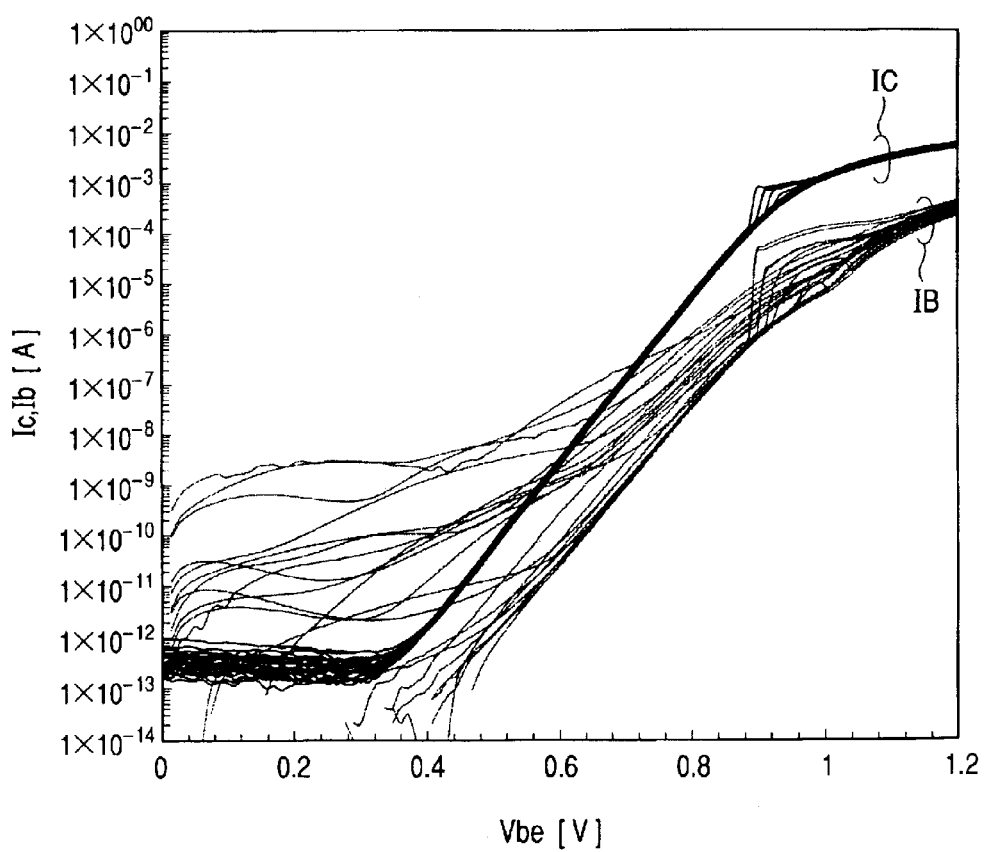
FIG. 36 is a graph of a base current and a collector current relative to a base-emitter voltage of the bipolar transistor investigated by the present inventors.

FIG. 35 is a graph showing the measurement results of base current Ib and collector current Ic relative to base emitter voltage Vbe of HBT 27 in Embodiment 1. FIG. 36 is a graph showing the measurement results of base current Ib and collector current Ic relative to the base emitter voltage Vbe of HBT investigated by the present inventors. Comparison between the results of FIG. 35 and FIG. 36 suggests that the base current Ib and collector current Ic are more stable and leakage current is much smaller in the HBT 27 of this Embodiment 1 than in the HBT investigated by the present inventors. In short, the crystallinity of the heterocrystalline layer 18 is good in Embodiment 1.

Embodiment 1 therefore makes it possible to improve the whole electrical properties of the semiconductor device having, for example, HBT 25 and CMIS circuit on the same substrate 1. Moreover, a rejection rate of the semiconductor device having the HBT 25 and CMIS circuit on the same substrate 1 can be reduced so that a yield of this semiconductor device can be improved. This leads to a cost reduction of this semiconductor device.

(Embodiment 2)

Figure 37:
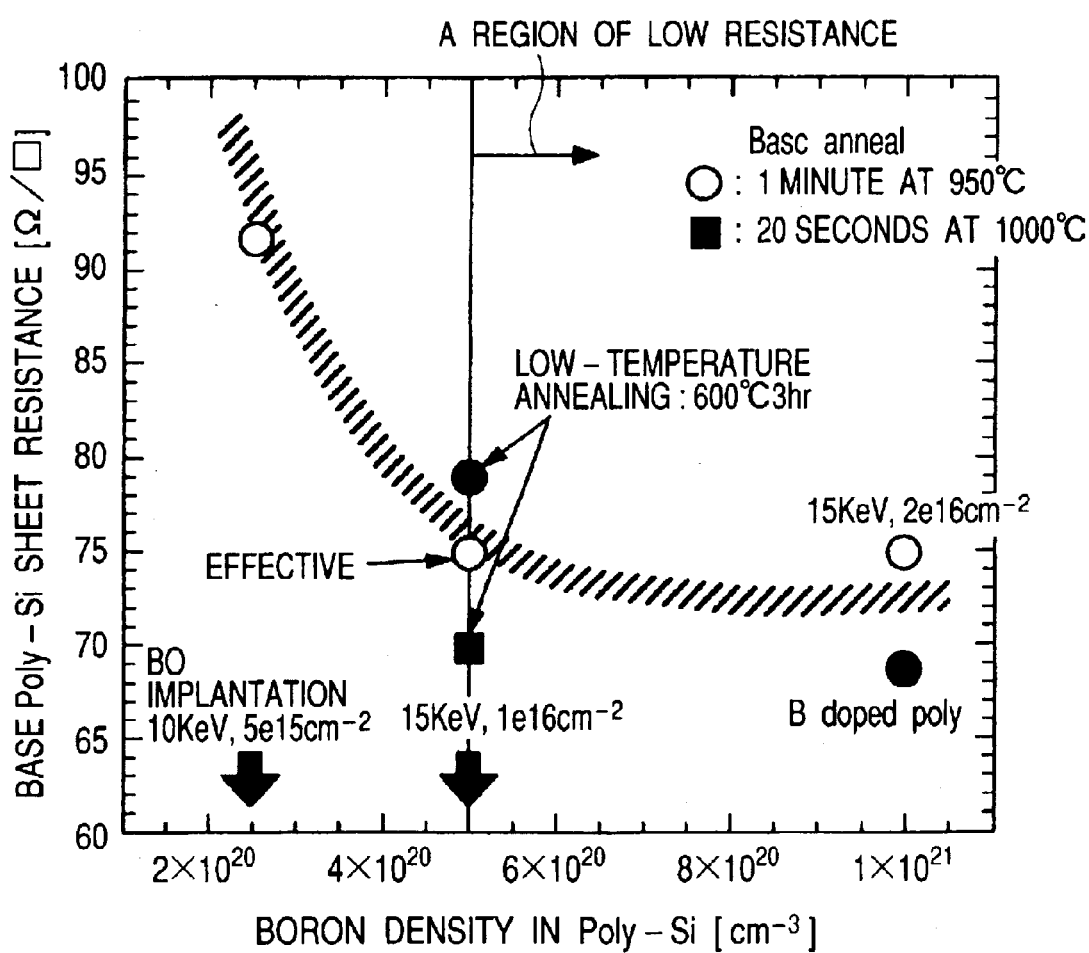
FIG. 37 is a graph illustrating the relationship between an impurity concentration in the base electrode formation film and resistance in a semiconductor device according to another embodiment of the present invention.
Figure 38:
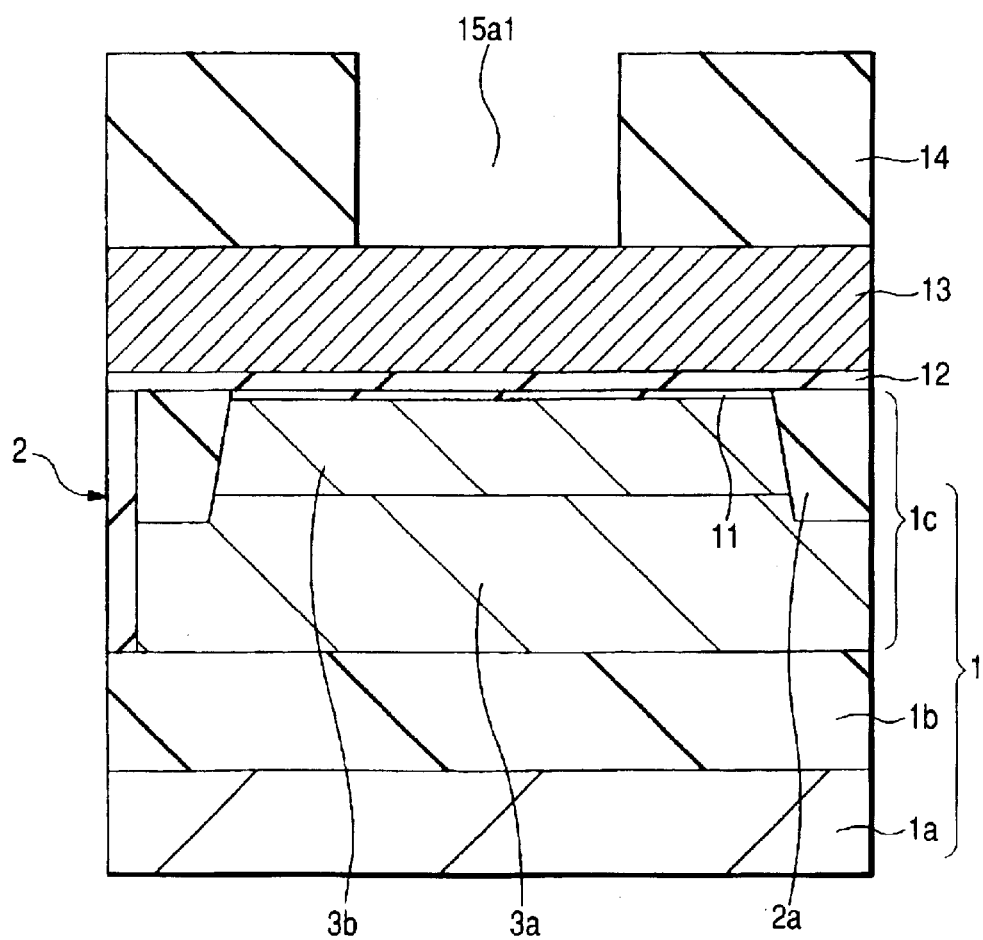
FIG. 38 is an enlarged fragmentary cross-sectional view of a bipolar transistor formation region during a manufacturing step of a semiconductor device according to a further embodiment of the present invention.

In Embodiment 2, upon deposition of the base electrode formation film 13 by CVD, for example, boron (B) is introduced uniformly thereinto at a high concentration. In this case, the boron concentration is set out so as to promote, upon sidewall oxidation treatment, oxidation of the whole side surface of the base electrode formation film 13 exposed from the side surface of the first emitter opening portion 15a and to form, with sufficient thickness, the insulating film 17 on the exposed side surface and shoulder portion (at the corner where the surface of the base electrode formation film 13 brought into contact with the insulating film 14 intersects with the exposed side surface). FIG. 37 is a graph showing the relationship between the impurity concentration in the base electrode formation film 13 and resistance. In this Embodiment 2, the impurity (boron) concentration in the base electrode formation film 13 is adjusted at $5 \times 10^{20}/cm^3$ or greater at which a decrease in the resistance of the base electrode formation film 13 starts. By the sidewall oxidation treatment at this concentration, the insulating film 17 can be formed with sufficient thickness at the side surface and shoulder portion of the base electrode formation film 13 and similar effects to Embodiment 1 are available. (Embodiment 3)

In Embodiment 3, a modification example of the formation step of the insulating film 17 will be described based on FIGS. 38 to 41. FIGS. 38 to 41 are enlarged fragmentary cross-sectional view of the HBT formation region in the manufacturing step of the semiconductor device according to Embodiment 3.

Figure 39:
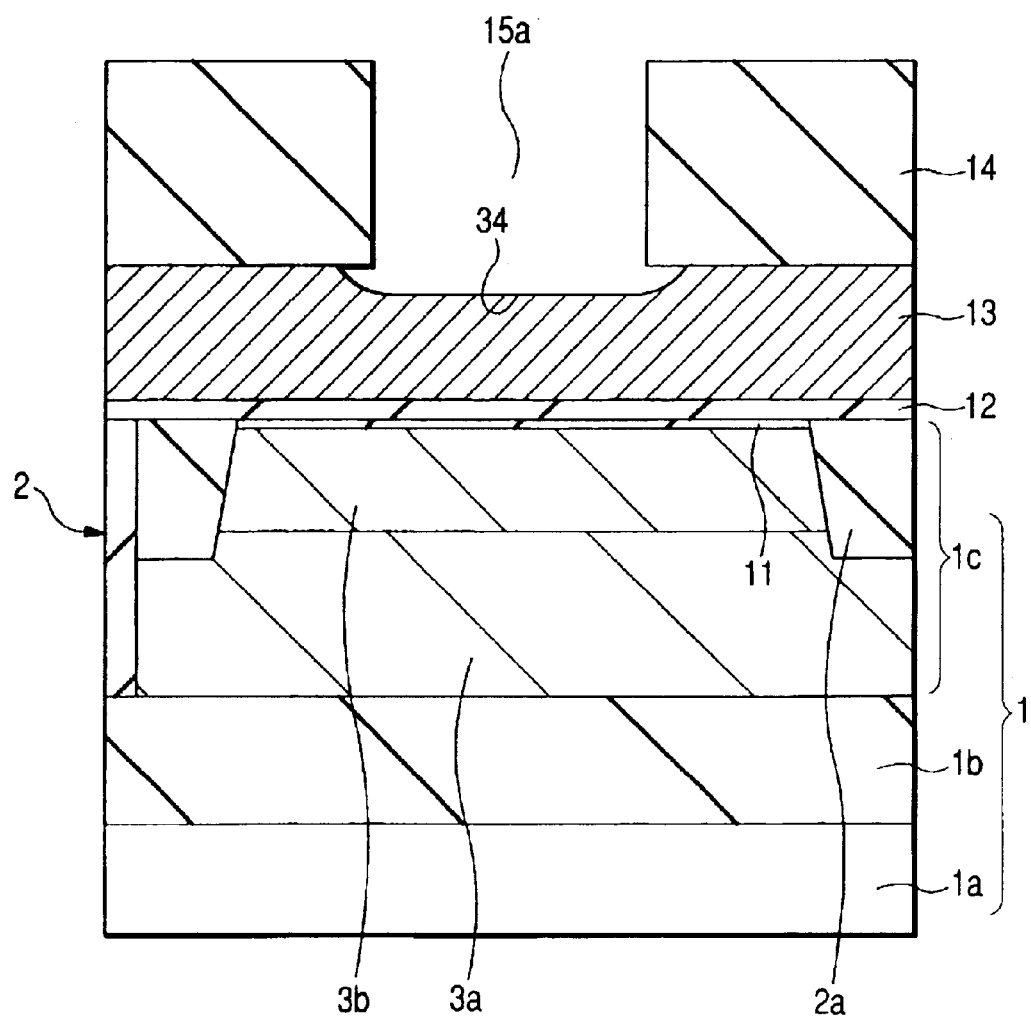
FIG. 39 is an enlarged fragmentary cross-sectional view of the bipolar transistor formation region during the manufacturing step of the semiconductor device following the step of FIG. 38.
Figure 40:
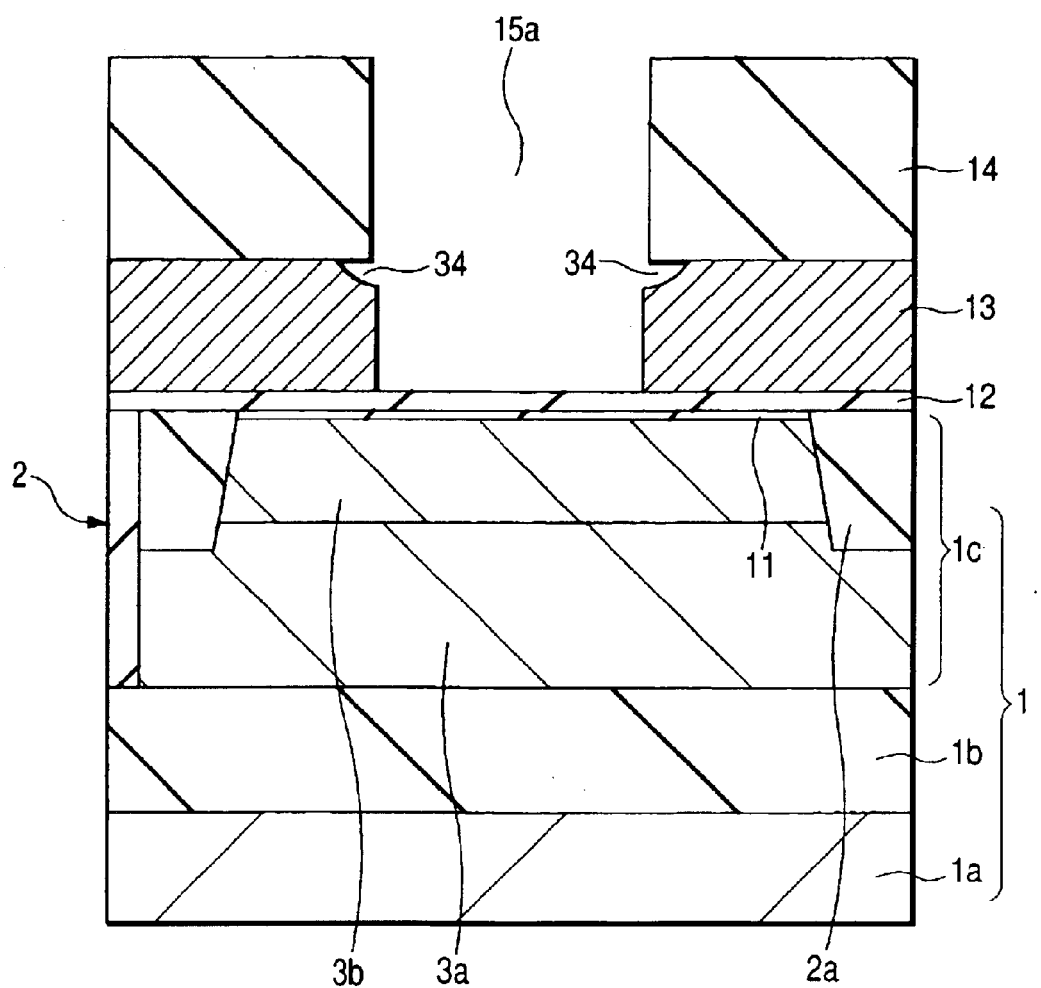
FIG. 40 is an enlarged fragmentary cross-sectional view of the bipolar transistor formation region during the manufacturing step of the semiconductor device following the step of FIG. 39.
Figure 41:
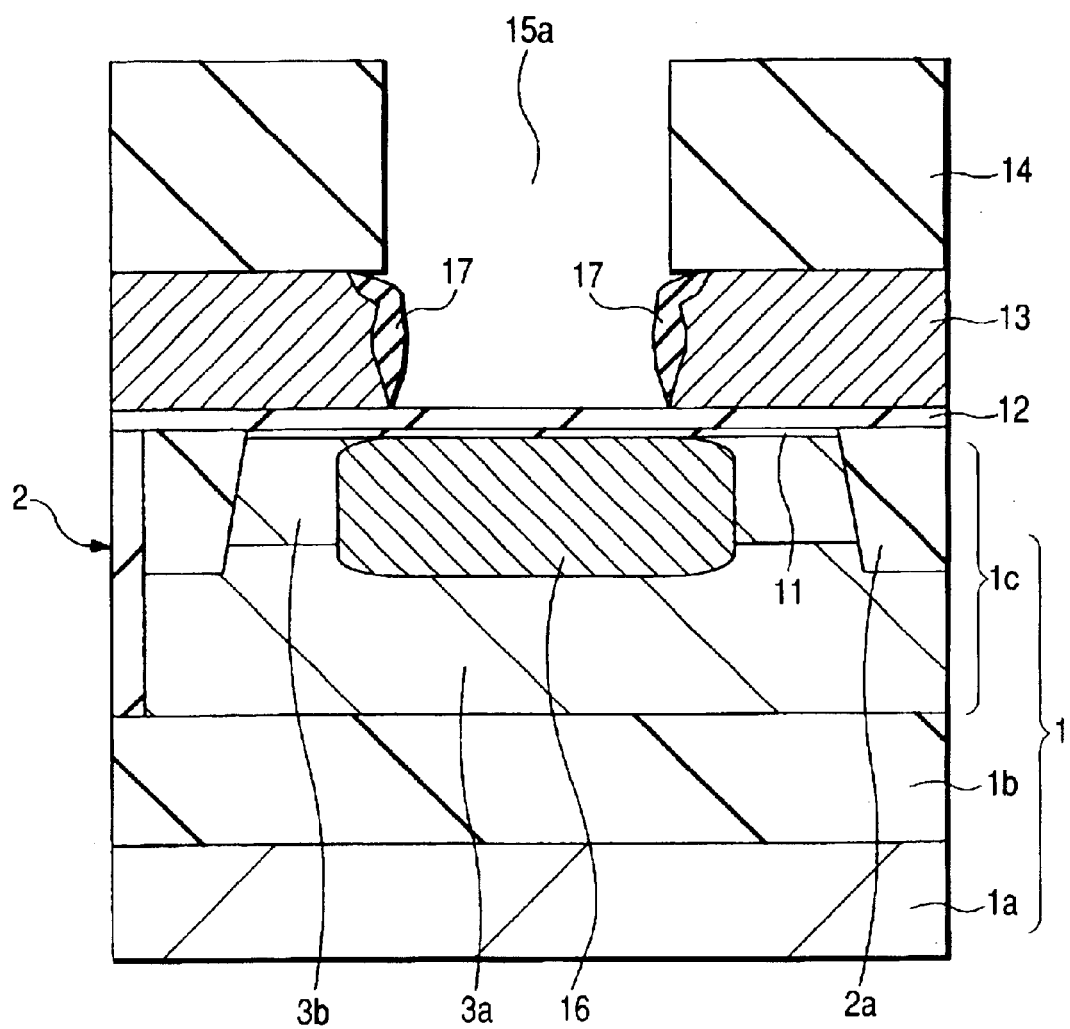
FIG. 41 is an enlarged fragmentary cross-sectional view of the bipolar transistor formation region during the manufacturing step of the semiconductor device following the step of FIG. 40.

After the steps as described above in FIGS. 1 to 9 in Embodiment 1, a first emitter opening portion 15a1 is opened in the insulating film 14 by lithography and dry etching. From the bottom surface of this first emitter opening portion 15a1, the upper surface of the base electrode formation film 13 is partially exposed. Then, the substrate 1 (SOI wafer) is subjected to isotropic wet etching, whereby as illustrated in FIG. 39, a shallow recess 34 is formed on the upper layer portion of the base electrode formation film 13 exposed from the first emitter opening portion 15a1. The periphery of this recess 34 partially lies below the insulating film 14. The substrate 1 (SOI wafer) is then subjected to anisotropic dry etching to remove the base electrode formation film 13 exposed from the first emitter opening portion 15a1, whereby a first emitter opening portion 15a is formed as illustrated in FIG. 40. From the bottom surface of this first emitter opening portion 15a, the upper surface of the insulating film 12 is partially exposed. The shoulder portion of the base electrode formation film 13 exposed from the first emitter opening portion 15a is chamfered by the recess 34. After first impurity introduction step for the formation of the SIC region, the sidwall oxidation treatment as described in Embodiment 1 is performed to form the insulating film 17 on the sidewalls and shoulder portion of the base electrode formation film 13 inside of the first emitter opening portion 15a. Since the shoulder portion of the base electrode formation film 13 is chamfered so that oxidation is promoted at the shoulder portion and the insulating film 17 at the shoulder portion of the base electrode formation film 13 is able to have a thickness enough to withstand the subsequent washing treatment with hydrofluoric acid. Accordingly, similar effects to Embodiment 1 are available.

The present invention made by the present inventors were so far described specifically based on some Embodiments. The present invention is not limited to or by these Embodiments and it is needless to say that the present invention can be modified within an extent not departing from the gist of the present invention.

For example, the gate electrode of MIS may be formed to have a so-called polymetal gate electrode structure obtained by stacking a metal film such as tungsten over a low-resistance polycrystalline silicon film via a barrier metal such as tungsten nitride.

In the above-described Embodiments, an SOI substrate was employed as the substrate. The substrate is not limited thereto but a conventional semiconductor substrate (wafer) available by cutting a semiconductor ingot prepared by crystal growth method is also usable. Alternatively, a so-called epitaxial wafer having an epitaxial layer disposed on the surface of an ordinarily employed semiconductor substrate may be used.

A description was so far made on the application of the invention made by the present inventors to a technique for a semiconductor device having HBT and CMIS disposed on the same substrate which was the background of the invention. The present invention can also be applied to a technique for a semiconductor device having not MIS but HBT, or a technique for a semiconductor device having either one of nMIS or pMIS and HBT on the same substrate.

Among the inventions disclosed by the present application, effects available by the typical ones will next be described briefly.

Since the present invention has a step of introducing an oxidation promoting impurity in the upper layer side of the base electrode formation film, the fourth insulating film can be formed with a sufficient thickness at the side surface of the base electrode formation film and the corner portion inside of the first emitter opening portion, making it possible to sufficiently wash, with hydrofluoric acid, the semiconductor substrate inside of the second emitter opening portion. The surface of the semiconductor substrate on which a heterocrystalline layer is to be grown can therefore be cleaned and the crystallinity of the heterocrystalline layer can be improved even at a low heat treatment temperature in a reducing gas atmosphere. It is therefore possible to improve the reliability of the semiconductor device equipped with HBT.

What is claimed is:

1. A method of manufacturing a semiconductor device, comprising steps of:
   (a) forming an isolation portion in a main surface of a semiconductor substrate;
   (b) forming a first insulating film over an active region encompassed by the isolation portion of the semiconductor substrate;
   (c) forming a second insulating film over the main surface of the semiconductor substrate after the step (b);
   (d) depositing a base electrode formation film over the second insulating film;
   (e) introducing an oxidation promoting impurity into an upper layer portion of the base electrode formation film;
   (f) depositing a third insulating film over the base electrode formation film;
   (g) removing a portion of the third insulating film and base electrode formation film to form a first emitter opening portion;
   (h) oxidizing the semiconductor substrate to form a fourth insulating film over a side surface of the base electrode formation film and a corner portion thereof on a side in contact with the third insulating film, each inside of the first emitter opening portion;
   (i) wet-etching the semiconductor substrate to remove the second insulating film through the first emitter opening portion, thereby forming a second emitter opening portion which is opened so that a side surface of the second insulating film is kept apart from the side surface of the base electrode formation film inside of the first emitter opening portion and from which a portion of the base electrode formation film is exposed;
   (j) washing the resulting semiconductor substrate with hydrofluoric acid to remove the first insulating film exposed from the second emitter opening portion;
   (k) heat treating the semiconductor substrate in a reducing gas atmosphere; and
   (l) selectively forming, by the epitaxial method, a heterocrystalline layer over the semiconductor substrate exposed from the second emitter opening portion.

2. A method according to claim 1, wherein the oxidation promoting impurity in the step (e) is boron difluoride, arsenic, oxygen, silicon or germanium.

3. A method according to claim 1, wherein the third insulating film of the step (f) is formed by chemical vapor deposition using plasma.

4. A method according to claim 1, wherein the heat treatment in the reducing gas atmosphere in the step (k) has a first heat treatment step in which the semiconductor substrate is heat treated at a first temperature and a second heat treatment step in which the semiconductor substrate after the first heat treatment step is heat treated at a second temperature higher than the first temperature.

5. A method according to claim 4, wherein the first temperature is a temperature not causing elimination of hydrogen bonded to the surface of the semiconductor substrate on which a heterocrystalline layer is to be grown.

6. A method according to claim 4, wherein the second temperature is a temperature not adversely affecting another element formed on the semiconductor substrate.

7. A method according to claim 1, further comprising the steps of, after the step (1):

(m) after removal of the fourth insulating film, depositing a fifth insulating film over the main surface of the semiconductor substrate including the inside of the first emitter opening portion;

(n) after deposition of a first emitter electrode formation film over the fifth insulating film, etching back the first emitter electrode formation film to leave the first emitter electrode formation film over a side surface side of the first emitter opening portion;

(o) removing the fifth insulating film by etching with the first emitter electrode formation film left by the etching back step as a mask, thereby exposing the heterocrystalline layer from the first emitter opening portion;

(p) after deposition of a second emitter electrode formation film over the main surface of the semiconductor substrate including the inside of the first emitter opening portion, patterning the second emitter electrode formation film to form an emitter electrode;

(q) after the step (p), patterning the base electrode formation film to form a base electrode; and (r) after the step (q), heat treating the semiconductor substrate to diffuse an impurity in the emitter electrode to the heterocrystalline layer, thereby forming an emitter region.

8. A method according to claim 7, further comprising the steps of:

after the step (a) but prior to the step (c), forming a gate insulating film of a field effect transistor over the semiconductor substrate in a field effect transistor formation region of the semiconductor substrate, forming a gate electrode over the gate insulating film, forming over the semiconductor substrate a first semiconductor region for source and drain of the field effect transistor and forming a sidewall insulating film over the side surface of the gate electrode;

after the step (q) but prior to the step (r), introducing an impurity for the formation of a second semiconductor region which is for source and drain of the field effect transistor and has a higher impurity concentration than the first semiconductor region; and in the step (r), simultaneously with the formation of the emitter region, activating the second semiconductor region of the field effect transistor.

9. A method according to claim 8, wherein the gate electrode formation step comprises the steps of:

depositing a gate electrode formation film over the main surface of the semiconductor substrate after the formation of the gate insulating film, introducing, in an n channel type field effect transistor formation region of the gate electrode formation film, an impurity for making the conductivity type of a gate electrode n-type, introducing, in a p channel type field effect transistor formation region of the gate electrode formation film, an impurity for making the conductivity type of a gate electrode to p-type, and patterning the gate electrode formation film to form an n type gate electrode in the formation region of the n channel type field effect transistor and a p type gate electrode in the formation region of the p channel type field effect transistor.

10. A method according to claim 7, further comprising the steps of, after the step (r), forming a conductor film over the main surface of the semiconductor substrate and heat treating the semiconductor substrate to form a silicide layer on at least a contact portion between the conductor film and emitter electrode, and conductor film and base electrode.

11. A method of manufacturing a semiconductor device, comprising steps of:

(a) forming an isolation portion in a main surface of a semiconductor substrate;

(b) forming a first insulating film over an active region encompassed by the isolation portion of the semiconductor substrate;

(c) forming a second insulating film over the main surface of the semiconductor substrate after the step (b);

(d) depositing a base electrode formation film over the second insulating film;

(e) depositing a third insulating film over the base electrode formation film;

(f) removing a portion of the third insulating film and base electrode formation film to form a first emitter opening portion;

(g) oxidizing the semiconductor substrate to form a fourth insulating film over a side surface of the base electrode formation film inside of the first emitter opening portion;

(h) wet etching the semiconductor substrate to remove the second insulating film through the first emitter opening portion, thereby forming a second emitter opening portion which is opened so that a side surface of the second insulating film is kept apart from the side surface of the base electrode formation film inside of the first emitter opening portion and from which a portion of the base electrode formation film is exposed;

(i) washing the semiconductor substrate with hydrofluoric acid to remove the first insulating film exposed from the second emitter opening portion;

(j) subjecting the semiconductor substrate to first heat treatment at a first temperature in a reducing gas or non-oxidizing gas atmosphere;

(k) after the step (j), subjecting the semiconductor substrate to second heat treatment at a second temperature higher than the first temperature in a reducing gas atmosphere; and (l) after the step (k), selectively forming, by the epitaxial method, a heterocrystalline layer over the semiconductor substrate exposed from the second emitter opening portion.

12. A method according to claim 11, wherein the first temperature in the step (j) is a temperature not causing elimination of hydrogen bonded to the surface of the semiconductor substrate on which a heterocrystalline layer is to be grown.

13. A method according to claim 11, wherein the second temperature in the step (k) is a temperature not adversely affecting another element formed on the semiconductor substrate.

14. A method according to claim 11, further comprising the steps of, after the step (1):

(m) after removal of the fourth insulating film, depositing a fifth insulating film over the main surface of the semiconductor substrate including the inside of the first emitter opening portion;

(n) after deposition of a first emitter electrode formation film over the fifth insulating film, etching back the first emitter electrode formation film to leave the first emitter electrode formation film over a side surface side of the first emitter opening portion;

(o) removing the fifth insulating film by etching with the first emitter electrode formation film left by the etching back step as a mask, thereby exposing the heterocrystalline layer from the first emitter opening portion;

(p) after deposition of a second emitter electrode formation film over the main surface of the semiconductor substrate including the inside of the first emitter opening portion, patterning the second emitter electrode formation film to form an emitter electrode;

(q) after the step (p), patterning the base electrode formation film to form a base electrode; and (r) after the step (q), heat treating the semiconductor substrate to diffuse an impurity in the emitter electrode to the heterocrystalline layer, thereby forming an emitter region.

15. A method according to claim 14, further comprising the steps of:

after the step (a) but prior to the step (c), forming a gate insulating film of a field effect transistor over the semiconductor substrate in the field effect transistor formation region of the semiconductor substrate, forming a gate electrode over the gate insulating film, forming over the semiconductor substrate a first semiconductor region for source and drain of the field effect transistor, and forming a sidewall insulating film over the side surface of the gate electrode;

after the step (q) but prior to the step (r), introducing an impurity for the formation of a second semiconductor region which is for source and drain of the field effect transistor and has a higher impurity concentration than the first semiconductor region; and in the step (r), simultaneously with the formation of the emitter region, activating the second semiconductor region of the field effect transistor.

16. A method according to claim 15, wherein the gate electrode formation step comprises the steps of:

depositing a gate electrode formation film over the main surface of the semiconductor substrate after the formation of the gate insulating film;

introducing, in an n channel type field effect transistor formation region of the gate electrode formation film, an impurity for making the conductivity type of the gate electrode to n-type;

introducing, in a p channel type field effect transistor formation region of the gate electrode formation film, an impurity for making the conductivity type of the gate electrode to p-type; and patterning the gate electrode formation film to form an n type gate electrode in the formation region of the n channel type field effect transistor and a p type gate electrode in the formation region of the p channel type field effect transistor.

17. A method of manufacturing a semiconductor device, comprising steps of:

(a) forming an isolation portion on a main surface of a semiconductor substrate;

(b) forming a first insulating film over an active region encompassed by the isolation portion of the semiconductor substrate;

(c) forming a second insulating film over the main surface of the semiconductor substrate after the step (b);

(d) depositing a base electrode formation film over the second insulating film;

(e) depositing a third insulating film over the base electrode formation film by chemical vapor deposition using plasma;

(f) removing a portion of the third insulating film and base electrode formation film to form a first emitter opening portion;

(g) oxidizing the semiconductor substrate to form a fourth insulating film over a side surface of the base electrode formation film inside of the first emitter opening portion;

(h) wet-etching the semiconductor substrate to remove the second insulating film through the first emitter opening portion, thereby forming a second emitter opening portion which is opened so that the side surface of the second insulating film is kept apart from the side surface of the base electrode formation film inside of the first emitter opening portion and from which a portion of the base electrode formation film is exposed;

(i) washing the semiconductor substrate with hydrofluoric acid to remove the first insulating film exposed from the second emitter opening portion;

(j) heat treating the semiconductor substrate in a reducing gas atmosphere; and (k) selectively forming, by an epitaxial method, a heterocrystalline layer over the semiconductor substrate exposed from the second emitter opening portion.

18. A method according to claim 17, wherein the heat treatment in the reducing gas atmosphere in the step (j) has a first heat treatment step in which the semiconductor substrate is heat treated at a first temperature and a second heat treatment step in which the semiconductor substrate after the first heat treatment step is heat treated at a second temperature higher than the first temperature.

19. A method according to claim 18, wherein the first temperature is a temperature not causing elimination of hydrogen bonded to the surface of the semiconductor substrate on which a heterocrystalline layer is to be grown.

20. A method according to claim 18, wherein the second temperature is a temperature not adversely affecting another element formed on the semiconductor substrate.

21. A method according to claim 17, further comprising the steps of, after the step (k):

(l) after removal of the fourth insulating film, depositing a fifth insulating film over the main surface of the semiconductor substrate including the inside of the first emitter opening portion;

(m) after deposition of a first emitter electrode formation film over the fifth insulating film, etching back the first emitter electrode formation film to leave the first emitter electrode formation film over a side surface side of the first emitter opening portion;

(n) removing the fifth insulating film by etching with the first emitter electrode formation film left by the etching back step as a mask, thereby exposing the heterocrystalline layer from the first emitter opening portion;

(o) after deposition of a second emitter electrode formation film over the main surface of the semiconductor substrate including the inside of the first emitter opening portion, patterning the second emitter electrode formation film to form an emitter electrode;

(p) after the step (o), patterning the base electrode formation film to form a base electrode; and (q) after the step (p), heat treating the semiconductor substrate to diffuse an impurity in the emitter electrode to the heterocrystalline layer, thereby forming an emitter region.

22. A method according to claim 21, further comprising the steps of:

after the step (a) but prior to the step (c), forming a gate insulating film of a field effect transistor over the semiconductor substrate in a field effect transistor formation region of the semiconductor substrate, forming a gate electrode over the gate insulating film, forming over the semiconductor substrate a first semiconductor region for source and drain of the field effect transistor, and forming a sidewall insulating film over the side surface of the gate electrode;

after the step (p) but prior to the step (q), introducing an impurity for the formation of a second semiconductor region which is for source and drain of the field effect transistor and has a higher impurity concentration than the first semiconductor region; and in the step (q), simultaneously with the formation of the emitter region, activating the second semiconductor region of the field effect transistor.

23. A method according to claim 22, wherein the gate electrode formation step comprises the steps of:

depositing a gate electrode formation film over the main surface of the semiconductor substrate after the formation of the gate insulating film;

introducing, in an n channel type field effect transistor formation region of the gate electrode formation film, an impurity for making the conductivity type of the gate electrode to n-type;

introducing, in a p channel type field effect transistor formation region of the gate electrode formation film, an impurity for making the conductivity type of the gate electrode to p-type; and patterning the gate electrode formation film to form an n type gate electrode in the n channel type field effect transistor formation region and a p type gate electrode in the p channel type field effect transistor formation region.

* * * * *